US012567572B2

(12) United States Patent　　(10) Patent No.:　US 12,567,572 B2
Carter et al.　　　　　　　　　　(45) Date of Patent:　　　Mar. 3, 2026

(54) PLASMA BEHAVIORS PREDICTED BY CURRENT MEASUREMENTS DURING ASYMMETRIC BIAS WAVEFORM APPLICATION

(71) Applicant: Advanced Energy Industries, Inc., Denver, CO (US)

(72) Inventors: Daniel Carter, Fort Collins, CO (US); Victor Brouk, Fort Collins, CO (US); Denis Shaw, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 165 days.

(21) Appl. No.: 18/350,516

(22) Filed: Jul. 11, 2023

(65) Prior Publication Data

US 2025/0022698 A1　　Jan. 16, 2025

(51) Int. Cl.
*H01J 37/32*　　　　(2006.01)

(52) U.S. Cl.
CPC .............................. *H01J 37/3299* (2013.01)

(58) Field of Classification Search
CPC ............. H01J 37/3299; H01J 37/32174; H01J 37/32706; H01J 37/32935
See application file for complete search history.

(56) References Cited

U.S. PATENT DOCUMENTS

| 1,055,412 | A | 3/1913 | Megill |
| 4,622,094 | A | 11/1986 | Otsubo |

| 4,693,805 | A | 9/1987 | Quazi |
| 4,798,650 | A | 1/1989 | Nakamura et al. |
| 4,891,118 | A | 1/1990 | Ooiwa et al. |
| 4,898,798 | A | 2/1990 | Sugata et al. |
| 4,963,239 | A | 10/1990 | Shimamura et al. |
| 5,057,185 | A | 10/1991 | Thomas, III et al. |
| 5,156,703 | A | 10/1992 | Oechsner |
| 5,160,397 | A | 11/1992 | Doki et al. |
| 5,179,264 | A | 1/1993 | Cuomo et al. |
| 5,242,561 | A | 9/1993 | Sato |

(Continued)

FOREIGN PATENT DOCUMENTS

| CN | 1451172 A | 10/2003 |
| CN | 1839459 A | 9/2006 |

(Continued)

OTHER PUBLICATIONS

Notice of Allowance received for U.S. Appl. No. 16/194,125 dated Jun. 18, 2020, 42 pages.

(Continued)

*Primary Examiner* — Lee E Rodak
*Assistant Examiner* — Zannatul Ferdous
(74) *Attorney, Agent, or Firm* — NOD Law PC

(57)　　　　　　ABSTRACT

A bias supply configured for predicting behavior of one or more aspects of a plasma load by measuring a current waveform is disclosed. The bias supply applies an asymmetric periodic voltage waveform and a corresponding current waveform. The asymmetric periodic voltage waveform includes a first section comprising a positive pulse peak and a second section comprising a negative voltage ramp. The bias supply receives data about the current waveform during the first section, and based upon the received data, provides information about a plasma load.

19 Claims, 13 Drawing Sheets

(56) References Cited

U.S. PATENT DOCUMENTS

| 5,247,669 A | 9/1993 | Abraham et al. |
| 5,250,165 A | 10/1993 | Berglund et al. |
| 5,332,880 A | 7/1994 | Kubota et al. |
| 5,410,691 A | 4/1995 | Taylor |
| 5,415,718 A | 5/1995 | Ohmi et al. |
| 5,427,669 A | 6/1995 | Drummond |
| 5,487,785 A | 1/1996 | Horike et al. |
| 5,517,084 A | 5/1996 | Leung |
| 5,531,862 A | 7/1996 | Otsubo et al. |
| 5,535,906 A | 7/1996 | Drummond |
| 5,556,501 A | 9/1996 | Collins et al. |
| 5,573,597 A | 11/1996 | Lantsman |
| 5,683,072 A | 11/1997 | Ohmi et al. |
| 5,705,931 A * | 1/1998 | Klick .................. H05H 1/0062 |
| | | 315/111.21 |
| 5,767,628 A | 6/1998 | Keller et al. |
| 5,770,972 A | 6/1998 | Freuler et al. |
| 5,815,366 A | 9/1998 | Morita et al. |
| 5,859,428 A | 1/1999 | Fruchtman |
| 5,907,221 A | 5/1999 | Sato et al. |
| 5,936,481 A | 8/1999 | Fujii |
| 5,983,828 A | 11/1999 | Savas |
| 6,030,667 A | 2/2000 | Nakagawa et al. |
| 6,051,114 A | 4/2000 | Yao et al. |
| 6,096,174 A | 8/2000 | Teschner et al. |
| 6,110,287 A | 8/2000 | Arai et al. |
| 6,129,806 A | 10/2000 | Kaji et al. |
| 6,156,667 A | 12/2000 | Jewett |
| 6,161,498 A | 12/2000 | Toraguchi et al. |
| 6,162,709 A | 12/2000 | Raoux et al. |
| 6,180,019 B1 | 1/2001 | Kazumi et al. |
| 6,201,208 B1 | 3/2001 | Wendt et al. |
| 6,273,022 B1 | 8/2001 | Pu et al. |
| 6,288,493 B1 | 9/2001 | Lee et al. |
| 6,291,938 B1 | 9/2001 | Jewett et al. |
| 6,313,583 B1 | 11/2001 | Arita et al. |
| 6,326,584 B1 | 12/2001 | Jewett et al. |
| 6,392,210 B1 | 5/2002 | Jewett et al. |
| 6,463,875 B1 | 10/2002 | Chen et al. |
| 6,478,924 B1 | 11/2002 | Shamouilian et al. |
| 6,507,155 B1 | 1/2003 | Barnes et al. |
| 6,544,895 B1 | 4/2003 | Donohoe |
| 6,568,346 B2 | 5/2003 | Pu et al. |
| 6,583,572 B2 | 6/2003 | Veltrop et al. |
| 6,617,794 B2 | 9/2003 | Barnes et al. |
| 6,621,674 B1 | 9/2003 | Zahiringer et al. |
| 6,646,385 B2 | 11/2003 | Howald et al. |
| 6,685,798 B1 | 2/2004 | Howald et al. |
| 6,694,915 B1 | 2/2004 | Howald et al. |
| 6,707,051 B2 | 3/2004 | Shun'ko |
| 6,714,033 B1 | 3/2004 | Makhratchev et al. |
| 6,724,148 B1 | 4/2004 | Gonzalez et al. |
| 6,756,737 B2 | 6/2004 | Doi et al. |
| 6,777,037 B2 | 8/2004 | Sumiya et al. |
| 6,794,301 B2 | 9/2004 | Savas |
| 6,819,096 B2 | 11/2004 | Gonzalez et al. |
| 6,822,396 B2 | 11/2004 | Gonzalez et al. |
| 6,863,018 B2 | 3/2005 | Koizumi et al. |
| 6,872,289 B2 | 3/2005 | Mizuno et al. |
| 6,885,153 B2 | 4/2005 | Quon |
| 6,885,453 B2 | 4/2005 | Kaufmann |
| 6,893,533 B2 | 5/2005 | Holland et al. |
| 6,913,938 B2 | 7/2005 | Shanmugasundram et al. |
| 6,920,312 B1 | 7/2005 | Benjamin |
| 6,924,455 B1 | 8/2005 | Chen et al. |
| 6,927,358 B2 | 8/2005 | Gonzalez et al. |
| 6,943,317 B1 | 9/2005 | Ilic et al. |
| 6,946,063 B1 | 9/2005 | Gonzalez et al. |
| 6,984,198 B2 | 1/2006 | Krishnamurthy et al. |
| 7,005,845 B1 | 2/2006 | Gonzalez et al. |
| 7,019,253 B2 | 3/2006 | Johnson et al. |
| 7,046,524 B2 | 5/2006 | Hoffman et al. |
| 7,059,267 B2 | 6/2006 | Hedberg et al. |
| 7,096,819 B2 | 8/2006 | Chen et al. |
| 7,122,965 B2 | 10/2006 | Goodman |
| 7,132,618 B2 | 11/2006 | Hoffman et al. |
| 7,201,936 B2 | 4/2007 | Schwarm et al. |
| 7,245,084 B1 | 7/2007 | Gonzalez et al. |
| 7,253,117 B2 | 8/2007 | Donohoe |
| 7,292,047 B2 | 11/2007 | Tanaka et al. |
| 7,297,637 B2 | 11/2007 | Hedberg et al. |
| 7,373,899 B2 | 5/2008 | Sumiya et al. |
| 7,468,494 B2 | 12/2008 | Gonzalez et al. |
| 7,520,956 B2 | 4/2009 | Samukawa et al. |
| 7,528,386 B2 | 5/2009 | Ruzic et al. |
| 7,645,357 B2 | 1/2010 | Paterson et al. |
| 7,725,208 B2 | 5/2010 | Shanmugasundram et al. |
| 7,737,702 B2 | 6/2010 | Pipitone |
| 7,764,140 B2 | 7/2010 | Nagarkatti et al. |
| 7,777,179 B2 | 8/2010 | Chen et al. |
| 7,783,375 B2 | 8/2010 | Shanmugasundram et al. |
| 7,811,939 B2 | 10/2010 | Kushibiki et al. |
| 7,847,247 B2 | 12/2010 | Denpoh |
| 7,928,664 B2 | 4/2011 | Beland |
| 8,012,306 B2 | 9/2011 | Dhindsa |
| 8,040,068 B2 | 10/2011 | Coumou et al. |
| 8,103,492 B2 | 1/2012 | Brcka |
| 8,140,292 B2 | 3/2012 | Wendt |
| 8,169,595 B2 | 5/2012 | Schriever et al. |
| 8,264,154 B2 | 9/2012 | Banner et al. |
| 8,319,436 B2 | 11/2012 | Carter et al. |
| 8,329,054 B2 | 12/2012 | Ichino et al. |
| 8,334,657 B2 | 12/2012 | Xia |
| 8,357,264 B2 | 1/2013 | Shannon et al. |
| 8,404,598 B2 | 3/2013 | Liao et al. |
| 8,409,398 B2 | 4/2013 | Brcka |
| 8,475,673 B2 | 7/2013 | Edelberg |
| 8,575,843 B2 | 11/2013 | Moore et al. |
| 8,641,916 B2 | 2/2014 | Yatsuda et al. |
| 8,674,606 B2 | 3/2014 | Carter et al. |
| 8,698,107 B2 | 4/2014 | Godet et al. |
| 8,742,669 B2 | 6/2014 | Carter et al. |
| 8,801,950 B2 | 8/2014 | Lee |
| 8,821,684 B2 | 9/2014 | Ul et al. |
| 8,900,402 B2 | 12/2014 | Holland et al. |
| 9,088,267 B2 | 7/2015 | Blackburn et al. |
| 9,105,447 B2 | 8/2015 | Brouk et al. |
| 9,114,666 B2 | 8/2015 | Valcore, Jr. et al. |
| 9,123,509 B2 | 9/2015 | Papasouliotis et al. |
| 9,177,756 B2 | 11/2015 | Holland et al. |
| 9,208,992 B2 | 12/2015 | Brouk et al. |
| 9,210,790 B2 | 12/2015 | Hoffman et al. |
| 9,283,635 B2 | 3/2016 | Peters |
| 9,287,086 B2 | 3/2016 | Brouk et al. |
| 9,287,092 B2 | 3/2016 | Brouk et al. |
| 9,305,803 B2 | 4/2016 | Morimoto et al. |
| 9,309,594 B2 | 4/2016 | Hoffman et al. |
| 9,362,089 B2 | 6/2016 | Brouk et al. |
| 9,378,931 B2 | 6/2016 | Kwon et al. |
| 9,390,893 B2 | 7/2016 | Valcore, Jr. et al. |
| 9,425,029 B2 | 8/2016 | Muto et al. |
| 9,435,029 B2 | 9/2016 | Brouk et al. |
| 9,478,397 B2 | 10/2016 | Blackburn et al. |
| 9,536,749 B2 | 1/2017 | Marakhtanov et al. |
| 9,593,421 B2 | 3/2017 | Baek et al. |
| 9,595,424 B2 | 3/2017 | Marakhtanov et al. |
| 9,604,877 B2 | 3/2017 | Veerasamy et al. |
| 9,667,211 B1 | 5/2017 | Wyse et al. |
| 9,685,297 B2 | 6/2017 | Carter et al. |
| 9,754,767 B2 | 9/2017 | Kawasaki |
| 9,754,768 B2 | 9/2017 | Yamada et al. |
| 9,761,414 B2 | 9/2017 | Marakhtanov et al. |
| 9,761,419 B2 | 9/2017 | Nagami |
| 9,767,988 B2 | 9/2017 | Brouk et al. |
| 9,788,405 B2 | 10/2017 | Kawasaki et al. |
| 9,818,584 B2 | 11/2017 | Miller et al. |
| 9,872,373 B1 | 1/2018 | Shimizu et al. |
| 9,892,888 B2 | 2/2018 | Baek et al. |
| 10,448,494 B1 | 10/2019 | Dorf et al. |
| 10,448,495 B1 | 10/2019 | Dorf et al. |
| 10,555,412 B2 | 2/2020 | Dorf et al. |
| 10,565,563 B1 | 2/2020 | Hays et al. |
| 10,607,813 B2 | 3/2020 | Fairbairn et al. |
| 10,707,055 B2 | 7/2020 | Shaw et al. |

(56) References Cited

U.S. PATENT DOCUMENTS

| | | | |
|---|---|---|---|
| 10,791,617 | B2 | 9/2020 | Dorf et al. |
| 10,811,227 | B2 | 10/2020 | Van Zyl et al. |
| 10,811,228 | B2 | 10/2020 | Van Zyl et al. |
| 10,811,229 | B2 | 10/2020 | Van Zyl et al. |
| 10,896,807 | B2 | 1/2021 | Fairbairn et al. |
| 11,011,349 | B2 | 5/2021 | Brouk et al. |
| 11,144,688 | B1 | 10/2021 | Ershov et al. |
| 11,189,454 | B2 | 11/2021 | Carter et al. |
| 11,264,209 | B2 | 3/2022 | Van Zyl et al. |
| 11,282,677 | B2 | 3/2022 | Shaw et al. |
| 11,284,500 | B2 | 3/2022 | Dorf et al. |
| 11,437,221 | B2 | 9/2022 | Carter et al. |
| 11,615,941 | B2 | 3/2023 | Brouk et al. |
| 11,670,487 | B1 * | 6/2023 | Nguyen .................. H03K 3/57 |
| | | | 307/52 |
| 11,842,884 | B2 | 12/2023 | Shaw et al. |
| 11,875,972 | B2 | 1/2024 | Driessen |
| 11,887,812 | B2 | 1/2024 | Nguyen et al. |
| 11,942,309 | B2 | 3/2024 | Singh |
| 11,978,611 | B2 | 5/2024 | Carter et al. |
| 11,978,613 | B2 | 5/2024 | Nguyen |
| 12,009,179 | B2 | 6/2024 | Nguyen |
| 12,046,448 | B2 | 7/2024 | Singh et al. |
| 12,125,674 | B2 | 10/2024 | Carter |
| 12,142,452 | B2 | 11/2024 | Carter et al. |
| 12,142,460 | B2 | 11/2024 | Shaw et al. |
| 2001/0014540 | A1 | 8/2001 | Shan et al. |
| 2002/0038631 | A1 | 4/2002 | Sumiya et al. |
| 2002/0115301 | A1 | 8/2002 | Savas |
| 2002/0144786 | A1 | 10/2002 | Chiang et al. |
| 2002/0150695 | A1 | 10/2002 | Kodama |
| 2002/0185228 | A1 | 12/2002 | Chen et al. |
| 2002/0189761 | A1 | 12/2002 | Hedberg et al. |
| 2003/0033116 | A1 | 2/2003 | Brcka et al. |
| 2003/0106647 | A1 | 6/2003 | Koshiishi et al. |
| 2004/0007326 | A1 | 1/2004 | Roche et al. |
| 2004/0094402 | A1 | 5/2004 | Gopalraja et al. |
| 2004/0149218 | A1 | 8/2004 | Collins et al. |
| 2004/0226657 | A1 | 11/2004 | Hoffman |
| 2005/0090118 | A1 | 4/2005 | Shannon et al. |
| 2005/0103275 | A1 | 5/2005 | Sasaki et al. |
| 2005/0160985 | A1 | 7/2005 | Brcka |
| 2005/0260354 | A1 | 11/2005 | Singh et al. |
| 2005/0264219 | A1 | 12/2005 | Dhindsa et al. |
| 2005/0279457 | A1 | 12/2005 | Matsudo et al. |
| 2006/0017388 | A1 | 1/2006 | Stevenson |
| 2006/0066248 | A1 | 3/2006 | Chistyakov |
| 2006/0088655 | A1 | 4/2006 | Collins et al. |
| 2006/0130971 | A1 | 6/2006 | Chang et al. |
| 2006/0171093 | A1 | 8/2006 | Ishimura et al. |
| 2006/0226786 | A1 | 10/2006 | Lin et al. |
| 2006/0278518 | A1 | 12/2006 | Kouznetsov |
| 2007/0035908 | A1 | 2/2007 | Kitsunai et al. |
| 2007/0121267 | A1 | 5/2007 | Kotani et al. |
| 2007/0139112 | A1 | 6/2007 | Bocock et al. |
| 2007/0139122 | A1 | 6/2007 | Nagarkatti et al. |
| 2007/0186855 | A1 | 8/2007 | Dhindsa |
| 2007/0186856 | A1 | 8/2007 | Yasui et al. |
| 2007/0193975 | A1 | 8/2007 | Wilson |
| 2007/0246163 | A1 | 10/2007 | Paterson et al. |
| 2007/0251813 | A1 | 11/2007 | Ilic et al. |
| 2008/0135400 | A1 | 6/2008 | Kadlec et al. |
| 2009/0044750 | A1 | 2/2009 | Pipitone |
| 2009/0077150 | A1 | 3/2009 | Wendt |
| 2009/0078678 | A1 | 3/2009 | Kojima et al. |
| 2009/0121912 | A1 | 5/2009 | Zanchi et al. |
| 2009/0183117 | A1 | 7/2009 | Chang |
| 2009/0183771 | A1 | 7/2009 | Sannomiya et al. |
| 2009/0200494 | A1 | 8/2009 | Hatem et al. |
| 2009/0255800 | A1 | 10/2009 | Koshimizu |
| 2009/0298287 | A1 | 12/2009 | Shannon et al. |
| 2010/0063787 | A1 | 3/2010 | Brcka |
| 2010/0072172 | A1 | 3/2010 | Ui et al. |
| 2010/0126893 | A1 | 5/2010 | Sinykin |
| 2010/0154994 | A1 | 6/2010 | Fischer et al. |
| 2010/0161353 | A1 | 6/2010 | Mayaud |
| 2010/0208409 | A1 | 8/2010 | Bluck et al. |
| 2010/0244802 | A1 | 9/2010 | Alexander |
| 2010/0248489 | A1 | 9/2010 | Koguchi et al. |
| 2010/0276273 | A1 | 11/2010 | Heckman et al. |
| 2010/0283395 | A1 | 11/2010 | Van et al. |
| 2010/0296977 | A1 | 11/2010 | Hancock |
| 2010/0332011 | A1 | 12/2010 | Venugopal et al. |
| 2011/0031217 | A1 | 2/2011 | Himori |
| 2011/0038187 | A1 | 2/2011 | Horishita et al. |
| 2011/0065161 | A1 | 3/2011 | Kwasinski et al. |
| 2011/0089023 | A1 | 4/2011 | Tanaka et al. |
| 2011/0095689 | A1 | 4/2011 | Gilbert |
| 2011/0097510 | A1 | 4/2011 | Makino et al. |
| 2011/0220491 | A1 | 9/2011 | Hilliard |
| 2011/0223750 | A1 | 9/2011 | Hayash et al. |
| 2011/0226617 | A1 | 9/2011 | Hofmann et al. |
| 2011/0248634 | A1 | 10/2011 | Heil et al. |
| 2011/0253672 | A1 | 10/2011 | Kamibayashi et al. |
| 2011/0259851 | A1 | 10/2011 | Brouk et al. |
| 2011/0318933 | A1 | 12/2011 | Yatsuda et al. |
| 2012/0000421 | A1 | 1/2012 | Miller et al. |
| 2012/0052599 | A1 | 3/2012 | Brouk et al. |
| 2012/0052689 | A1 | 3/2012 | Tokashiki |
| 2012/0080408 | A1 | 4/2012 | Ul et al. |
| 2012/0097524 | A1 | 4/2012 | Pipitone et al. |
| 2012/0187844 | A1 | 7/2012 | Hoffman et al. |
| 2012/0217221 | A1 | 8/2012 | Hoffman et al. |
| 2012/0318456 | A1 | 12/2012 | Brouk et al. |
| 2012/0319584 | A1 | 12/2012 | Brouk et al. |
| 2013/0001196 | A1 | 1/2013 | Hoffman et al. |
| 2013/0006555 | A1 | 1/2013 | Roberg et al. |
| 2013/0083566 | A1 | 4/2013 | Gaknoki et al. |
| 2013/0122711 | A1 | 5/2013 | Marakhtanov et al. |
| 2013/0136872 | A1 | 5/2013 | Booth et al. |
| 2013/0206338 | A1 | 8/2013 | Tanaka |
| 2013/0320853 | A1 | 12/2013 | Carter et al. |
| 2014/0061156 | A1 | 3/2014 | Brouk et al. |
| 2014/0062303 | A1 | 3/2014 | Hoffman et al. |
| 2014/0062495 | A1 | 3/2014 | Carter et al. |
| 2014/0117861 | A1 | 5/2014 | Finley et al. |
| 2014/0117872 | A1 | 5/2014 | Finley |
| 2014/0148016 | A1 | 5/2014 | Kanazawa et al. |
| 2014/0173158 | A1 | 6/2014 | Valcore, Jr. |
| 2014/0231389 | A1 | 8/2014 | Nagami et al. |
| 2014/0263182 | A1 | 9/2014 | Chen et al. |
| 2014/0265910 | A1 | 9/2014 | Kobayashi et al. |
| 2014/0302682 | A1 | 10/2014 | Muto et al. |
| 2014/0305905 | A1 * | 10/2014 | Yamada ............ H01J 37/32568 |
| | | | 156/345.28 |
| 2014/0317563 | A1 | 10/2014 | O'Byrne |
| 2015/0076112 | A1 | 3/2015 | Sriraman et al. |
| 2015/0126037 | A1 | 5/2015 | Chen et al. |
| 2015/0144596 | A1 | 5/2015 | Brouk et al. |
| 2015/0170886 | A1 | 6/2015 | Morimoto et al. |
| 2015/0222181 | A1 | 8/2015 | Coleman |
| 2015/0270104 | A1 | 9/2015 | Van Zyl |
| 2015/0279624 | A1 | 10/2015 | Toyota et al. |
| 2015/0315698 | A1 | 11/2015 | Chistyakov |
| 2015/0325413 | A1 | 11/2015 | Km et al. |
| 2015/0371827 | A1 | 12/2015 | Godet et al. |
| 2016/0020072 | A1 | 1/2016 | Brouk et al. |
| 2016/0020108 | A1 | 1/2016 | Ranjan et al. |
| 2016/0027616 | A1 | 1/2016 | Ramaswamy et al. |
| 2016/0053017 | A1 | 2/2016 | Orentas et al. |
| 2016/0056017 | A1 | 2/2016 | Kim et al. |
| 2016/0064247 | A1 | 3/2016 | Tomura et al. |
| 2016/0079037 | A1 | 3/2016 | Hirano et al. |
| 2016/0126068 | A1 | 5/2016 | Lee et al. |
| 2016/0126069 | A1 | 5/2016 | Kwon et al. |
| 2016/0240353 | A1 | 8/2016 | Nagami |
| 2016/0351375 | A1 | 12/2016 | Valcore, Jr. et al. |
| 2017/0018411 | A1 | 1/2017 | Sriraman et al. |
| 2017/0029941 | A1 | 2/2017 | Allen et al. |
| 2017/0053820 | A1 | 2/2017 | Bosch et al. |
| 2017/0062190 | A1 | 3/2017 | Lee et al. |
| 2017/0099723 | A1 | 4/2017 | Nagami et al. |
| 2017/0154781 | A1 | 6/2017 | Ranjan et al. |
| 2017/0256381 | A1 * | 9/2017 | Denpoh ............ H01J 37/32128 |

(56) References Cited

U.S. PATENT DOCUMENTS

| 2017/0278665 A1 | 9/2017 | Carter et al. |
| 2017/0286389 A1 | 10/2017 | Ceneviva et al. |
| 2017/0330731 A1 | 11/2017 | Van Zyl |
| 2017/0345620 A1 | 11/2017 | Coumou et al. |
| 2017/0358431 A1 | 12/2017 | Dorf et al. |
| 2018/0019100 A1 | 1/2018 | Brouk et al. |
| 2018/0047573 A1 | 2/2018 | Tanaka et al. |
| 2018/0082824 A1 | 3/2018 | Likhanskii et al. |
| 2018/0166249 A1 | 6/2018 | Dorf et al. |
| 2018/0226225 A1 | 8/2018 | Koh et al. |
| 2018/0233321 A1 | 8/2018 | Caron |
| 2018/0342903 A1 | 11/2018 | Luu et al. |
| 2018/0373885 A1 | 12/2018 | Arad et al. |
| 2019/0066979 A1 | 2/2019 | Shoeb et al. |
| 2019/0157040 A1 | 5/2019 | Fairbairn et al. |
| 2019/0157041 A1 | 5/2019 | Zyl et al. |
| 2019/0157042 A1 | 5/2019 | Van Zyl et al. |
| 2019/0157043 A1 | 5/2019 | Shaw et al. |
| 2019/0172685 A1 | 6/2019 | Van Zyl et al. |
| 2019/0180982 A1 | 6/2019 | Brouk et al. |
| 2020/0090905 A1 | 3/2020 | Brouk et al. |
| 2020/0111644 A1 | 4/2020 | Long et al. |
| 2020/0135527 A1 | 4/2020 | Sung et al. |
| 2020/0154556 A1 | 5/2020 | Dorf et al. |
| 2020/0203128 A1 | 6/2020 | Fairbairn et al. |
| 2020/0294642 A1 | 9/2020 | Bostic et al. |
| 2020/0357607 A1 | 11/2020 | Ziemba et al. |
| 2021/0005428 A1 | 1/2021 | Shaw et al. |
| 2021/0013006 A1 | 1/2021 | Nguyen et al. |
| 2021/0035225 A1 | 2/2021 | Simpson et al. |
| 2021/0042516 A1 | 2/2021 | Panakkal |
| 2021/0074513 A1 | 3/2021 | Van Zyl et al. |
| 2021/0118649 A1 | 4/2021 | Huh et al. |
| 2021/0134562 A1 | 5/2021 | Fairbairn et al. |
| 2021/0202209 A1 | 7/2021 | Van Zyl et al. |
| 2021/0241996 A1 | 8/2021 | Carter et al. |
| 2021/0327679 A1 | 10/2021 | Carter et al. |
| 2021/0351007 A1 | 11/2021 | Carter |
| 2022/0013330 A1 | 1/2022 | Driessen et al. |
| 2022/0037121 A1 | 2/2022 | Dorf et al. |
| 2022/0037122 A1* | 2/2022 | Bowman ........... H01J 37/32174 |
| 2022/0116033 A1 | 4/2022 | Miller et al. |
| 2022/0157555 A1 | 5/2022 | Carter et al. |
| 2022/0223377 A1 | 7/2022 | Driessen |
| 2022/0270856 A1 | 8/2022 | Poulose et al. |
| 2022/0285131 A1 | 9/2022 | Shaw et al. |
| 2022/0384149 A1 | 12/2022 | Shi et al. |
| 2022/0415615 A1 | 12/2022 | Cubaynes et al. |
| 2023/0050119 A1 | 2/2023 | Martinez et al. |
| 2023/0050841 A1 | 2/2023 | Nguyen |
| 2023/0116058 A1 | 4/2023 | Carter et al. |
| 2023/0238216 A1 | 7/2023 | Singh et al. |
| 2023/0253187 A1 | 8/2023 | Singh |
| 2023/0268162 A1 | 8/2023 | Van et al. |
| 2023/0343556 A1 | 10/2023 | Nguyen |
| 2023/0369016 A1 | 11/2023 | Carter et al. |
| 2023/0377839 A1 | 11/2023 | Carter et al. |
| 2023/0377840 A1 | 11/2023 | Carter et al. |
| 2023/0395354 A1 | 12/2023 | Shaw et al. |
| 2023/0395355 A1 | 12/2023 | Shaw et al. |
| 2024/0030001 A1 | 1/2024 | Nguyen et al. |
| 2024/0055225 A1 | 2/2024 | Brouk et al. |
| 2024/0071721 A1 | 2/2024 | Brouk et al. |
| 2024/0079210 A1 | 3/2024 | Nguyen |
| 2024/0194452 A1 | 6/2024 | Singh |
| 2024/0242945 A1 | 7/2024 | Nguyen et al. |
| 2024/0304419 A1 | 9/2024 | Nguyen |

FOREIGN PATENT DOCUMENTS

| CN | 101685772 A | 3/2010 |
| CN | 201465987 U | 5/2010 |
| CN | 101835334 A | 9/2010 |
| CN | 101978461 A | 2/2011 |
| CN | 101990353 A | 3/2011 |
| CN | 102217045 A | 10/2011 |
| CN | 102405512 A | 4/2012 |
| CN | 105097404 A | 11/2015 |
| CN | 106537776 A | 3/2017 |
| CN | 206272512 U | 6/2017 |
| CN | 106920729 A | 7/2017 |
| CN | 107005169 A | 8/2017 |
| CN | 111788655 A | 10/2020 |
| CN | 114222958 A | 3/2022 |
| DE | 19912981 C1 | 12/2000 |
| EP | 0 383 570 A2 | 8/1990 |
| EP | 1 978 542 A1 | 10/2008 |
| EP | 1 129 481 B1 | 2/2012 |
| GB | 2 382 459 A | 5/2003 |
| GB | 2 400 613 A | 10/2004 |
| JP | 60-126832 A | 7/1985 |
| JP | S62-125626 A | 6/1987 |
| JP | 2141572 A | 5/1990 |
| JP | H2-141572 A | 5/1990 |
| JP | H4-193329 A | 7/1992 |
| JP | H6-243992 A | 9/1994 |
| JP | H9-293600 A | 11/1997 |
| JP | H1-1087097 A | 3/1999 |
| JP | 11-298303 A | 10/1999 |
| JP | 2001-237234 A | 8/2001 |
| JP | 2001-525601 A | 12/2001 |
| JP | 2002-050611 A | 2/2002 |
| JP | 2003-133404 A | 5/2003 |
| JP | 2004-085446 A | 3/2004 |
| JP | 2004-193564 A | 7/2004 |
| JP | 2005-527078 A | 9/2005 |
| JP | 2005-534187 A | 11/2005 |
| JP | 2006-147269 A | 6/2006 |
| JP | 2006-286254 A | 10/2006 |
| JP | 2007-311182 A | 11/2007 |
| JP | 2007-336148 A | 12/2007 |
| JP | 4016325 B2 | 12/2007 |
| JP | 2008-501224 A | 1/2008 |
| JP | 2008-157906 A | 7/2008 |
| JP | 2009-071133 A | 4/2009 |
| JP | 2009-514176 A | 4/2009 |
| JP | 2009-540569 A | 11/2009 |
| JP | 2010-103465 A | 5/2010 |
| JP | 2010-219026 A | 9/2010 |
| JP | 2010-238960 A | 10/2010 |
| JP | 2011-519115 A | 6/2011 |
| JP | 2011-222292 A | 11/2011 |
| JP | 2012-079886 A | 4/2012 |
| JP | 2012-104382 A | 5/2012 |
| JP | 2015-115564 A | 6/2015 |
| JP | 2015-534212 A | 11/2015 |
| JP | 2015-534718 A | 12/2015 |
| JP | 2016-500132 A | 1/2016 |
| JP | 2017-055100 A | 3/2017 |
| JP | 6141478 B2 | 6/2017 |
| JP | 6203476 B2 | 9/2017 |
| JP | 2018-195588 A | 12/2018 |
| JP | 2019-523993 A | 8/2019 |
| JP | 2019-197892 A | 11/2019 |
| JP | 2021-503700 A | 2/2021 |
| JP | 2021-503701 A | 2/2021 |
| JP | 2021-503702 A | 2/2021 |
| JP | 2022-541004 A | 9/2022 |
| KR | 1020110016486 A | 2/2011 |
| KR | 10-2012-0019428 A | 3/2012 |
| KR | 10-1800623 B1 | 11/2017 |
| TW | 514967 B | 12/2002 |
| TW | 200610451 A | 3/2006 |
| TW | 200811905 A | 3/2008 |
| TW | 200915375 A | 4/2009 |
| TW | 200952560 A | 12/2009 |
| TW | 201009879 A | 3/2010 |
| TW | 201142068 A | 12/2011 |
| TW | 201415522 A | 4/2014 |
| TW | 201614097 A | 4/2016 |
| TW | 201621974 A | 6/2016 |
| TW | 201637069 A | 10/2016 |
| WO | 91/09150 A1 | 6/1991 |
| WO | 95/07544 A1 | 3/1995 |

(56)     References Cited

FOREIGN PATENT DOCUMENTS

| WO | 97/49267 | A1 | 12/1997 |
| WO | 02/15222 | A2 | 2/2002 |
| WO | 02/19395 | A1 | 3/2002 |
| WO | 2004/012220 | A2 | 2/2004 |
| WO | 2004/114461 | A2 | 12/2004 |
| WO | 2010008006 | A1 | 1/2010 |
| WO | 2010/013476 | A1 | 2/2010 |
| WO | 2010/080421 | A2 | 7/2010 |
| WO | 2010126893 | A2 | 11/2010 |
| WO | 2012/007483 | A1 | 1/2012 |
| WO | 2012/030500 | A1 | 3/2012 |
| WO | 2012103101 | A1 | 8/2012 |
| WO | 2013/016619 | A1 | 1/2013 |
| WO | 2014/035889 | A1 | 3/2014 |
| WO | 2014/035897 | A1 | 3/2014 |
| WO | 2014/035899 | A1 | 3/2014 |
| WO | 2017/126184 | A1 | 7/2017 |
| WO | 2020/077536 | A1 | 4/2020 |
| WO | 2021/064110 | A1 | 4/2021 |
| WO | 2021/068697 | A1 | 4/2021 |
| WO | 2021/068701 | A1 | 4/2021 |
| WO | 2021/231035 | A1 | 11/2021 |
| WO | 2022/013017 | A1 | 1/2022 |
| WO | 2022/013018 | A1 | 1/2022 |

OTHER PUBLICATIONS

Notice of Allowance received for U.S. Appl. No. 16/246,996 dated Jun. 18, 2020, 27 pages.
Notice of Allowance received for U.S. Appl. No. 16/270,391 dated Jun. 16, 2020, 36 pages.
Notice of Allowance received for U.S. Appl. No. 16/278,822 dated Dec. 1, 2022, 13 pages.
Notice of Allowance received for U.S. Appl. No. 16/803,020 dated Sep. 14, 2020, 100 pages.
Notice of Allowance received for U.S. Appl. No. 16/896,709 dated Nov. 17, 2021, 46 pages.
Notice of Allowance received for U.S. Appl. No. 17/031,027 dated Feb. 3, 2022, 8 pages.
Notice of Allowance received for U.S. Appl. No. 17/031,027 dated Oct. 20, 2021, 81 pages.
Notice of Allowance received for U.S. Appl. No. 17/150,633 dated Nov. 15, 2022, 42 pages.
Notice of Allowance received for U.S. Appl. No. 17/171,164 dated Jun. 8, 2022, 13 pages.
Notice of Allowance received for U.S. Appl. No. 17/171,164 dated May 4, 2022, 38 pages.
Notice of Allowance received for U.S. Appl. No. 17/584,921 dated Nov. 16, 2022, 9 pages.
Notice of Final Rejection received for Japanese Patent Application Serial No. 2013547731 dated Jul. 28, 2015, 13 pages.
Notice of Grounds for Rejection received for Korean Patent Application Serial No. 1020157007771 dated May 31, 2018, 4 pages.
Notice of Grounds for Rejection received for Korean Patent Application Serial No. 1020177033224 dated Aug. 6, 2018, 7 pages.
Notice of Grounds for Rejection received for Korean Patent Application Serial No. 1020187029468 dated Feb. 7, 2019, 6 pages.
Notice of Reasons for Rejection received for Japanese Patent Application Serial No. 2013547731 dated Sep. 30, 2014, 8 pages.
Notice of Reasons for Rejection received for Japanese Patent Application Serial No. 2017091857 dated Feb. 2, 2018, 10 pages.
Notice of Reasons for Rejection received for Japanese Patent Application Serial No. 2020081092 dated Apr. 1, 2021, 6 pages.
Notice of Reasons for Rejection received for Japanese Patent Application Serial No. 2020545048 dated Aug. 19, 2022, 12 pages.
Office Action received for Chinese Patent Application Serial No. 201180046783.1 dated Dec. 7, 2016, 9 pages.
Office Action received for Chinese Patent Application Serial No. 201180046783.1 dated Dec. 8, 2015, 9 pages.
Office Action received for Chinese Patent Application Serial No. 201180046783.1 dated May 17, 2016, 8 pages.
Office Action received for Chinese Patent Application Serial No. 201280047162.X dated Apr. 26, 2016, 7 pages.
Office Action received for Chinese Patent Application Serial No. 201280047162.X dated Oct. 24, 2016, 31 pages.
Office Action received for Chinese Patent Application Serial No. 201380056068.5 dated Jun. 12, 2017, 16 pages.
Office Action received for Chinese Patent Application Serial No. 201380056068.5 dated Oct. 17, 2016, 15 pages.
Office Action received for Chinese Patent Application Serial No. 201380056070.2 dated Apr. 2, 2018, 6 pages.
Office Action received for Chinese Patent Application Serial No. 201380056070.2 dated Aug. 15, 2016, 25 pages.
Office Action received for Chinese Patent Application Serial No. 201380056070.2 dated Jul. 11, 2017, 13 pages.
Office Action received for European Patent Application Serial No. 10770205.2 dated Nov. 2, 2017, 30 pages.
Office Action received for European Patent Application Serial No. 10770205.2 dated Oct. 22, 2019, 6 pages.
Office Action received for European Patent Application Serial No. 11822326.2 dated Apr. 3, 2017, 4 pages.
Office Action received for European Patent Application Serial No. 11822326.2 dated Feb. 27, 2018, 5 pages.
Office Action received for European Patent Application Serial No. 11822326.2 dated Oct. 18, 2018, 6 pages.
Office Action received for Japanese Patent Application Serial No. 2012508593 dated Apr. 19, 2013, 11 pages.
Office Action received for Japanese Patent Application Serial No. 2013527088 dated Apr. 21, 2015, 10 pages.
Office Action received for Japanese Patent Application Serial No. 2014523057 dated Apr. 21, 2015, 11 pages.
Office Action received for Japanese Patent Application Serial No. 2015529905 dated Aug. 22, 2017, 16 pages.
Office Action received for Japanese Patent Application Serial No. 2015529905 dated Aug. 24, 2017, 14 pages.
Office Action received for Japanese Patent Application Serial No. 2015529906 dated May 16, 2017, 13 pages.
Office Action received for Japanese Patent Application Serial No. 2015529939 dated Sep. 19, 2017, 19 pages.
Office Action received for Japanese Patent Application Serial No. 2016-043215 dated Jan. 25, 2017, 7 pages.
Office Action received for Japanese Patent Application Serial No. 2018081644 dated Apr. 16, 2019, 21 pages.
Office Action received for Japanese Patent Application Serial No. 2018138425 dated Mar. 24, 2020, 7 pages.
Office Action received for Japanese Patent Application Serial No. 2018138425 dated May 22, 2019, 10 pages.
Office Action received for Japanese Patent Application Serial No. 20205545044 dated Aug. 25, 2022, 6 pages.
Office Action received for Korean Patent Application Serial No. 1020117009075 dated Mar. 25, 2013, 2 pages.
Office Action received for Korean Patent Application Serial No. 1020137007594 dated Jul. 28, 2014, 2 pages.
Office Action received for Korean Patent Application Serial No. 1020137019332 dated May 29, 2015, 18 pages.
Office Action received for Korean Patent Application Serial No. 1020147004544 dated Feb. 3, 2016, 13 pages.
Office Action received for Korean Patent Application Serial No. 1020157006726 dated Feb. 19, 2018, 10 pages.
Office Action received for Korean Patent Application Serial No. 1020157007273 dated Jan. 30, 2018, 8 pages.
Office Action received for Korean Patent Application Serial No. 1020157007516 dated Feb. 15, 2017, 18 pages.
Office Action received for Taiwan Patent Application Serial No. 107140922 dated Feb. 1, 2021, 9 pages.
Office Action received for Taiwan Patent Application Serial No. 110136912 dated Feb. 23, 2022, 10 pages.
Office Action received for Taiwanese Patent Application Serial No. 102130565 dated Apr. 11, 2016, 2 pages.
Office Action received for Taiwanese Patent Application Serial No. 099113815 dated Jan. 27, 2014, 6 pages.

(56) References Cited

OTHER PUBLICATIONS

Office Action received for Taiwanese Patent Application Serial No. 099113815 dated Jun. 18, 2014, 5 pages.
Office Action received for Taiwanese Patent Application Serial No. 101127182 dated Aug. 11, 2014, 11 pages.
Office Action received for Taiwanese Patent Application Serial No. 102130565 dated Aug. 20, 2015, 4 pages.
Office Action received for Taiwanese Patent Application Serial No. 102130565 dated Jul. 14, 2015, 4 pages.
Office Action received for Taiwanese Patent Application Serial No. 102130984 dated Feb. 19, 2016, 4 pages.
Office Action received for Taiwanese Patent Application Serial No. 107140924 dated Apr. 28, 2020, 14 pages.
Office Action Received for Taiwanese Patent Application Serial No. 107140924 dated Jan. 15, 2021, 12 pages.
Office Action received for Taiwanese Patent Application Serial No. 107140926 dated May 28, 2020, 12 pages.
Office Action received for Taiwanese Patent Application No. 10714924 dated Aug. 18, 2021, 5 pages.
Office Action received for Taiwanese Patent Application Serial No. Re: Taiwan Patent Application No. 110111617 dated Jun. 30, 2022, 8 pages.
Office Action rereceived for Japanese Patent Application Serial No. 2012508593 dated Sep. 11, 2013, 7 pages.
Ohachi, T., et al., "Measurement of Nitrogen Atomic Flux for RF-MBE Growth of GaN and AlN on Si Substrates", J. of Crystal Growth, vol. 311, 2009, pp. 2987-2991.
Raoux, S., et al., "Remote Microwave Plasma Source for Cleaning Chemical Vapor Deposition Chambers; Technology for Reducing Global Warming Gas Emissions", J. Vac. Sci. Technol. B, vol. 17, No. 2, Mar./Apr. 1999, pp. 477-485.
Rauf, S., et al.., "Nonlinear Dynamics of Radio Frequency Plasma Processing Reactors Powered by Multifrequency Sources", IEEE Transactions on Plasma Science, vol. 27, No. 5, Oct. 5, 1999, pp. 1329-1338.
Requirement for Restriction received for U.S. Appl. No. 12/870,837 dated Dec. 19, 2012, 8 pages.
Requirement for Restriction received for U.S. Appl. No. 13/193,299 dated Aug. 8, 2013, 7 pages.
Requirement for Restriction received for U.S. Appl. No. 13/193,345 dated Jun. 6, 2013, 8 pages.
Requirement for Restriction received for U.S. Appl. No. 13/596,976 dated Feb. 23, 2015, 8 pages.
Requirement for Restriction received for U.S. Appl. No. 13/597,050 dated Jan. 27, 2015, 7 pages.
Requirement for Restriction received for U.S. Appl. No. 13/597,093 dated Mar. 23, 2015, 9 pages.
Requirement for Restriction received for U.S. Appl. No. 14/011,305 dated Aug. 15, 2014, 14 pages.
Requirement for Restriction received for U.S. Appl. No. 14/803,815 dated Nov. 17, 2017, 8 pages.
Requirement for Restriction received for U.S. Appl. No. 15/495,513 dated Nov. 29, 2019, 6 bages.
Requirement for Restriction received for U.S. Appl. No. 15/667,239 dated Dec. 23, 2019, 6 pages.
Requirement for Restriction received for U.S. Appl. No. 16/557,209 dated Sep. 21, 2021, 6 pages.
Requirement for Restriction received for U.S. Appl. No. 16/926,876 dated Apr. 29, 2022, 9 pages.
Second Office Action received for Chinese Patent Application Serial No. 201080003206.X dated May 23, 2014, 6 pages.
Second Office Action received for Chinese Patent Application Serial No. 201710704712.5 dated Sep. 27, 2019, 11 pages.
Second Office Action received for Chinese Patent Application Serial No. 201711336133.6 dated Jan. 6, 2020, 7 bages.
Silapunt, R., et al., "Ion Bombardment Energy Control for Selective Fluorocarbon Plasma Etching of Organosilicate Glass", J. Vac. Sci. Technol, vol. B 22, No. 2, 2004, pp. 826-831.
Specification for related U.S. Appl. No. 13/173,752, filed Jun. 30, 2011, 48 pages.

Specification for related U.S. Appl. No. 13/425,159, filed Mar. 20, 2012, 33 pages.
Third Office Action received for Chinese Patent Application Serial No. 201080003206.X dated Nov. 26, 2014, 6 pages.
Third Office Action received for Chinese Patent Application Serial No. 201710704712.5 dated Jan. 3, 2020, 8 pages.
Third Office Action received for Chinese Patent Application Serial No. 201711336133.6 dated Oct. 10, 2020, 21 pages.
Vahedi, V., et al., "Verification of Frequency Scaling Laws for Capacitive Radio-Frequency Discharges Using Two-Dimensional Simulations", Phys. Fluids B, , vol. 5, No. 7, Jul. 1993, pp. 2719-2729.
Wakeham, S.J., et al.. , "Low Temperature Remote Plasma Sputtering of Indium Tin Oxide for Flexible Display Applications", Thin Solid Films, vol. 519, 2009, pp. 1355-1358.
Wang, S.B., et al., "Control of Ion Energy Distribution at Substrates During Plasma Processing", J. Applied Physics, vol. 88, No. 2, Jul. 15, 2000, pp. 643-646.
Wendt "Thomson Innovation Patent Export", Mar. 10, 2009, 10 pages.
Xiubo, et al., "Charging of Dielectric Substrate Materials During Plasma Immersion Ion Implantation", Nuclear Instruments and Methods in Physics Research B, vol. 187, 2002, pp. 485-491.
Yun, Y.B., et al., "Effects of Various Additive Gases on Chemical Dry Etching Rate Enhancement of Low-k SiOCH ayer in F2/Ar Remote Plasmas", Thin Solid Films, vol. 516, 2008, pp. 3549-3553.
Notice of Allowance received for U.S. Appl. No. 16/194,104 dated Mar. 27, 2020, 37 pages.
Extended European Search Report received for European Patent Application Serial No. 18877737.9 dated Aug. 25. 2021, 165 pages.
Extended European Search Report received for European Patent Application Serial No. 10770205.2 dated Jan. 30, 2013, 8 pages.
Extended European Search Report received for European Patent Application Serial No. 18877322.0 Sep. 14, 2021, 129 pages.
Extended European Search Report received for European Patent Application Serial No. 18878531.5 dated Sep. 1, 2021, 126 pages.
Final Office Action received for U.S. Appl. No. 17/150,633 dated Jul. 27, 2022, 48 pages.
Final Office Action received for U.S. Appl. No. 12/767,775 dated Dec. 15, 2014, 37 pages.
Final Office Action received for U.S. Appl. No. 12/767,775 dated Sep. 10, 2013, 30 pages.
Final Office Action received for U.S. Appl. No. 12/870,837 dated Dec. 20, 2013, 33 pages.
Final Office Action received for U.S. Appl. No. 13/193,299 dated Dec. 4, 2015, 30 pages.
Final Office Action received for U.S. Appl. No. 13/193,299 dated Sep. 26, 2014, 37 pages.
Final Office Action received for U.S. Appl. No. 13/193,345 dated Jan. 15, 2016, 33 pages.
Final Office Action received for U.S. Appl. No. 13/193,345 dated Jul. 7, 2014, 26 pages.
Final Office Action received for U.S. Appl. No. 13/596,976 dated Apr. 5, 2017, 23 pages.
Final Office Action received for U.S. Appl. No. 13/596,976 dated Jul. 1, 2016, 34 pages.
Final Office Action received for U.S. Appl. No. 13/597,032 dated Apr. 9, 2015, 32 pages.
Final Office Action received for U.S. Appl. No. 13/597,050 dated Mar. 10, 2016, 19 pages.
Final Office Action received for U.S. Appl. No. 13/597,093 dated Jul. 8, 2016, 25 pages.
Final Office Action received for U.S. Appl. No. 14/803,815 dated Mar. 12, 2019, 15 pages.
Final Office Action received for U.S. Appl. No. 15/495,513 dated Apr. 14, 2021, 20 pages.
Final Office Action received for U.S. Appl. No. 16/278,822 dated Feb. 15, 2022, 52 pages.
First Office Action received for Chinese Patent Application Serial No. 201080003206.X dated Sep. 4, 2013, 15 pages.
First Office Action received for Chinese Patent Application Serial No. 201180046783.1 dated Mar. 24, 2015, 18 pages.

(56) References Cited

OTHER PUBLICATIONS

First Office Action received for Chinese Patent Application Serial No. 201280047162.X dated Sep. 6, 2015, 18 pages.

First Office Action received for Chinese Patent Application Serial No. 20171074712.5 dated Feb. 22, 2019, 9 pages.

First Office Action received for Chinese Patent Application Serial No. 201711336133.6 dated Mar. 4, 2019, 16 pages.

Fourth Office Action received for Chinese Patent Application Serial No. 201080003206.X dated Jun. 10, 2015, 8 pages.

Fourth Office Action received for Chinese Patent Application Serial No. 201710704712.5 dated Apr. 1, 2020, 7 pages.

Gangoli, S.P., et al., "Production and transport chemistry of atomic fluorine in remote plasma source and cylindrical reaction chamber", J. Phys. D: Appl. Phys., vol. 40, Aug. 16, 2007, pp. 5140-5154.

George, M.A., et al., "Silicon Nitride Arc Thin Films by New Plasma Enhanced Chemical Vapor Deposition Source Technology", Article downloaded from www.generalplasma.com, Jul. 7, 2011, pp. 1-5.

Giangregorio, M.M., et al., "Role of Plasma Activation in Tailoring the Nanostructure of Multifunctional Oxides Thin3 Films", Applied Surface Sci., vol. 255, Sep. 10, 2008, pp. 5396-5400.

Non Final Office Action received for U.S. Appl. No. 13/596,976 dated Nov. 6, 2015, 77 pages.

Non Final Office Action received for U.S. Appl. No. 13/596,976 dated Nov. 25, 2016, 20 pages.

Non Final Office Action received for U.S. Appl. No. 13/597,032 dated Jun. 20, 2014, 42 pages.

Non Final Office Action received for U.S. Appl. No. 13/597,050 dated Jul. 17, 2015, 86 pages.

Non Final Office Action received for U.S. Appl. No. 13/597,093 dated Nov. 5, 2015, 76 pages.

Non Final Office Action received for U.S. Appl. No. 13/597,093 dated Nov. 10, 2016, 23 pages.

Non Final Office Action received for U.S. Appl. No. 14/011,305 dated Dec. 4, 2014, 28 pages.

Non Final Office Action received for U.S. Appl. No. 14/606,857 dated Apr. 8, 2015, 51 pages.

Non Final Office Action received for U.S. Appl. No. 14/740,955 dated Feb. 2, 2016, 16 pages.

Non Final Office Action received for U.S. Appl. No. 14/803,815 dated Jul. 3, 2018, 67 pages.

Non Final Office Action received for U.S. Appl. No. 15/667,239 dated Jun. 24, 2020, 131 pages.

Non Final Office Action received for U.S. Appl. No. 16/193,790 dated Sep. 4, 2019, 86 pages.

Non Final Office Action received for U.S. Appl. No. 16/194,104 dated Aug. 1, 2019, 83 pages.

Non Final Office Action received for U.S. Appl. No. 16/194,125 dated Dec. 12, 2019, 88 pages.

Non Final Office Action received for U.S. Appl. No. 16/278,822 dated Aug. 2, 2021, 107 pages.

Non Final Office Action received for U.S. Appl. No. 16/278,822 dated Sep. 14, 2022, 9 pages.

Non Final Office Action received for U.S. Appl. No. 16/557,209 dated May 12, 2022, 30 pages.

Non Final Office Action received for U.S. Appl. No. 16/926,876 dated Sep. 26, 2022, 7 pages.

Non Final Office Action received for U.S. Appl. No. 16/926,876 dated Sep. 29, 2022, 80 pages.

Non-Final Office Action received for U.S. Appl. No. 17/150,633 dated Nov. 24, 2021, 52 pages.

Non-Final Office Action received for U.S. Appl. No. 15/495,513 dated Jul. 2, 2020, 87 pages.

Non-Final Office Action received for U.S. Appl. No. 16/246,996 dated Dec. 12, 2019, 85 pages.

Non-Final Office Action received for U.S. Appl. No. 16/270,391 dated Dec. 12, 2019, 78 pages.

Non-Final Office Action received for U.S. Appl. No. 16/803,020 dated Apr. 22, 2020, 36 pages.

Non-Final Office Action received for U.S. Appl. No. 16/896,709 dated May 25, 2021, 50 pages.

Non-Final Office Action received for U.S. Appl. No. 17/031,027 dated Apr. 28, 2021, 29 pages.

Non-Final Office Action received for U.S. Appl. No. 17/171,164 dated Oct. 15, 2021, 59 pages.

Notice of Allowance received for U.S. Appl. No. 12/767,775 dated Jan. 22, 2016, 50 pages.

Notice of Allowance received for U.S. Appl. No. 12/870,837 dated Feb. 12, 2016, 6 pages.

Notice of Allowance received for U.S. Appl. No. 12/870,837 dated Jan. 20, 2016, 37 pages.

Notice of Allowance received for U.S. Appl. No. 13/193,299 dated Jul. 6, 2016, 6 pages.

Notice of Allowance received for U.S. Appl. No. 13/193,299 dated May 20, 2016, 9 pages.

Notice of Allowance received for U.S. Appl. No. 13/193,345 dated Feb. 4, 2016, 16 pages.

Notice of Allowance received for U.S. Appl. No. 13/193,345 dated Mar. 7, 2016, 8 pages.

Notice of Allowance received for U.S. Appl. No. 13/596,976 dated Jul. 31, 2017, 6 pages.

Notice of Allowance received for U.S. Appl. No. 13/596,976 dated May 8, 2017, 17 pages.

Notice of Allowance received for U.S. Appl. No. 13/596,976 dated May 17, 2017, 6 pages.

Notice of Allowance received for U.S. Appl. No. 13/597,032 dated Aug. 28, 2015, 41 pages.

Notice of Allowance received for U.S. Appl. No. 13/597,050 dated Apr. 13, 2016, 15 pages.

Notice of Allowance received for U.S. Appl. No. 13/597,050 dated Apr. 20, 2016, 6 pages.

Notice of Allowance received for U.S. Appl. No. 13/597,093 dated Apr. 19, 2017, 2 pages.

Notice of Allowance received for U.S. Appl. No. 13/597,093 dated Mar. 17, 2017, 13 pages.

Notice of Allowance received for U.S. Appl. No. 14/011,305 dated Jun. 5, 2015, 24 pages.

Notice of Allowance received for U.S. Appl. No. 14/606,857 dated Sep. 24, 2015, 31 pages.

Notice of Allowance received for U.S. Appl. No. 15/495,513 dated Jul. 26, 2021, 18 pages.

Notice of Allowance received for U.S. Appl. No. 15/495,513 dated Oct. 27, 2021, 8 pages.

Notice of Allowance received for U.S. Appl. No. 15/667,239 dated Jan. 13, 2021, 26 pages.

Notice of Allowance received for U.S. Appl. No. 16/193,790 dated Jan. 23, 2020, 16 pages.

Notice of Allowance received for U.S. Appl. No. 16/193,790 dated Nov. 20, 2019, 40 pages.

Notice of Allowance received for U.S. Appl. No. 16/194,104 dated Mar. 2, 2020, 55 pages.

EPO, Extended European Search Report issued in Application No. 21803110.2, Jun. 6, 2024, pp. 11.

Japan Patent Office, Notice of Reasons for Rejection issued in JP Application No. 2022-568414, Oct. 10, 2024.

JPO, Notice of Reasons for Rejection issued in Application No. 2022-501232, May 29, 2024, 10 pages, Published in JP.

PCT, International Preliminary Report on Patentability issued in PCT/US2022/053703, Aug. 8, 2024, 7 pages.

PCT, International Preliminary Report on Patentability issued in PCT/US2022/053706, Aug. 8, 2024, 8 pages.

PCT, International Preliminary Report on Patentability issued in PCT/US2022/053709, Aug. 8, 2024, 7 pages.

PCT, International Search Report and Written Opinion issued in PCT/US2024/011334, Jun. 21, 2024, 16 pages.

PCT, International Search Report and Written Opinion issued in PCT/US2024/035494, Sep. 19, 2024, 14 pages.

PCT, International Search Report and Written Opinion issued PCT/US2023/073153, Feb. 9, 2024, 18 pages.

Skibinski, Tomi Sweet, Non-final Office Action issued in U.S. Appl. No. 18/656,543, filed Nov. 15, 2024, 21 pages.

(56) References Cited

OTHER PUBLICATIONS

TIPO, Office Action issued in Application No. 109123604, Jun. 24, 2024, 26 pages, Published in Taiwan.

Yu, Yuechuan, Final Office Action issued in U.S. Appl. No. 18/318,861, filed Nov. 12, 2024, 95 pages.

Yu, Yuechuan, Non-final office action issued in U.S. Appl. No. 18/318,861, filed Mar. 20, 2024, 51 pages.

Heil, S.B.S., et al., "Deposition of TiN and HfO2 in a Commercial 200mm Plasma Atomic Layer Deposition Reactor", J. Vac. Sci. Technol. A, Sep./Oct. 2007, Jul. 31, 2007, vol. 25, No. 5, pp. 1357-1366.

Honda, S., et al., "Hydrogenation of Polycrystalline Silicon Thin Films", Thin Solid Films, vol. 501, Oct. 5, 2005, pp. 144-148.

International Preliminary Report on Patentability Chapter I received for International PCT Application Serial No. PCT/US2020/041771 dated Jan. 27, 2022, 10 pages.

International Preliminary Report on Patentability received for International PCT Application Serial No. PCT/US2010/032582 dated Nov. 10, 2011, 8 pages.

International Preliminary Report on Patentability received for International PCT Application Serial No. PCT/US2011/047467 dated Mar. 14, 2013, 7 pages.

International Preliminary Report on Patentability received for International PCT Application Serial No. PCT/US2012/020219 dated Jul. 18, 2013, 7 pages.

International Preliminary Report on Patentability received for International PCT Application Serial No. PCT/US2012/048504 dated Feb. 6, 2014, 11 pages.

International Preliminary Report on Patentability received for International PCT Application Serial No. PCT/US2013/056634 dated Mar. 12, 2015, 7 pages.

International Preliminary Report on Patentability received for International PCT Application Serial No. PCT/US2013/056647 dated Mar. 12, 2015, 7 pages.

International Preliminary Report on Patentability received for International PCT Application Serial No. PCT/US2013/056657 dated Mar. 12, 2015, 8 pages.

International Preliminary Report on Patentability received for International PCT Application Serial No. PCT/US2013/056659 dated Mar. 12, 2015, 8 pages.

International Preliminary Report on Patentability received for International PCT Application Serial No. PCT/US2013/056851 dated Mar. 12, 2015, 8 pages.

International Preliminary Report on Patentability Received for International PCT Application Serial No. PCT/US2018/061653 dated May 28, 2020, 9 pages.

International Preliminary Report on Patentability received for International PCT Application Serial No. PCT/US2018/061671 dated May 28, 2020, 14 pages.

International Preliminary Report on Patentability received International Application Serial No. PCT/US2018/061575 dated May 28, 2020, 9 pages.

International Search Report and Writen Opinion received for International PCT Application Serial No. PCT/US2012/048504 dated Sep. 17, 2012, 13 pages.

International Search Report and Written Opinion received for International Application Serial No. PCT/US2020/027927 dated Sep. 17, 2021, 14 pages.

International Search Report and Written Opinion received for International PCT Application Serial No. PCT/US2010/032582 dated Feb. 21, 2011, 10 pages.

International Search Report and Written Opinion received for International PCT Application Serial No. PCT/US2011/047467 dated Nov. 24, 2011, 9 pages.

International Search Report and Written Opinion received for International PCT Application Serial No. PCT/US2012/022380 dated Mar. 14, 2012, 11 pages.

International Search Report and Written Opinion received for International PCT Application Serial No. PCT/US2012/029953 dated May 28, 2012, 11 pages.

International Search Report and Written Opinion received for International PCT Application Serial No. PCT/US2012/20219 dated Feb. 22, 2012, 10 pages.

International Search Report and Written Opinion received for International PCT Application Serial No. PCT/US2013/056634 dated Nov. 15, 2013, 10 pages.

International Search Report and Written Opinion received for International PCT Application Serial No. PCT/US2013/056647 dated Oct. 30, 2013, 10 pages.

International Search Report and Written Opinion received for International PCT Application Serial No. PCT/US2013/056657 dated Oct. 28, 2013, 11 pages.

International Search Report and Written Opinion received for International PCT Application Serial No. PCT/US2013/056659 dated Nov. 8, 2013, 11 pages.

International Search Report and Written Opinion received for International PCT Application Serial No. PCT/US2013/056851 dated Nov. 18, 2013, 11 pages.

International Search Report and Written Opinion received for International PCT Application Serial No. PCT/US2018/061575 dated Mar. 6, 2019, 12 pages.

International Search Report and Written Opinion received for International PCT Application Serial No. PCT/US2018/061653 dated Mar. 8, 2019, 10 pages.

International Search Report and Written Opinion received for International PCT Application Serial No. PCT/US2018/061671 dated Mar. 13, 2019, 17 pages.

International Search Report and Written Opinion received for International PCT Application Serial No. PCT/US2021/027927 dated Sep. 17, 2021, 9 pages.

International Search Report and Written Opinion received for International PCT Application Serial No. PCT/US2022/014888 dated Mar. 25, 2022, 18 pages.

International Search Report and Written Opinion received for International PCT Application Serial No. PCT/US2022/016278 dated May 17, 2022, 10 pages.

International Search Report and Written Opinion received for International PCT Application Serial No. PCT/US2022/016279 dated Jun. 9, 2022, 8 pages.

International Search Report and Written Opinion received for International PCT Application Serial No. PCT/US2022/040046 dated Oct. 27, 2022, 9 pages.

Jeon, M., et al., "Hydrogenated Amorphous Silicon Film as Intrinsic Passivation Layer Deposited at Various Temperatures using RF remote-PECVD technique", Current Applied Physics, vol. 10, No. 2010, Nov. 12, 2009, pp. S237-S240.

Kim, J.Y., et al., "Remote Plasma Enhanced Atomic Layer Deposition of TiN Thin Films Using Metalorganic Precursor", J. Vac. Sci. Technol. A, vol. 22, No. 1, Jan./Feb. 2004, Nov. 13, 2003, pp. 8-12.

Krolak, M, "Matthew Krolak's MyElectricEngine.Com Megnetoplasmadynamic (MPD) Thruster Design", Webpage downloaded from http://myelectricengine.com/projects/mpdthruster/mpdthruster.html, Apr. 28, 2011, 7 pages.

Kuo, M.S., et al., "Influence of C4F8/Ar-based etching and H2-based remote plasma ashing processes on ultralow ? Materials Modifications", J. Vac. Sci. Technol. B, vol. 28, No. 2, Mar./Apr. 2010, Mar. 19, 2010, pp. 284-294.

Non Final Office Action received for U.S. Appl. No. 12/767,775 dated Apr. 25, 2013, 28 pages.

Non Final Office Action received for U.S. Appl. No. 12/767,775 dated Jul. 1, 2014, 48 pages.

Non Final Office Action received for U.S. Appl. No. 12/767,775 dated Jun. 17, 2015, 28 pages.

Non Final Office Action received for U.S. Appl. No. 12/767,775 dated Oct. 17, 2012, 33 pages.

Non Final Office Action received for U.S. Appl. No. 12/870,837 dated Apr. 9, 2015, 40 pages.

Non Final Office Action received for U.S. Appl. No. 12/870,837 dated Mar. 22, 2013, 46 pages.

Non Final Office Action received for U.S. Appl. No. 13/193,299 dated Dec. 18, 2013, 43 pages.

Non Final Office Action received for U.S. Appl. No. 13/193,299 dated May 21, 2015, 24 pages.

(56) References Cited

OTHER PUBLICATIONS

Non Final Office Action received for U.S. Appl. No. 13/193,345 dated Apr. 16, 2015, 34 pages.

Non Final Office Action received for U.S. Appl. No. 13/193,345 dated Nov. 7, 2013, 36 pages.

Non Final Office Action received for U.S. Appl. No. 13/343,576 dated Nov. 13, 2014, 24 pages.

International Search Report and Written Opinion received for International PCT Application Serial No. PCT/US2022/053706 dated Apr. 3, 2023, 14 pages.

International Search Report and Written Opinion received for International PCT Application Serial No. PCT/US2022/053709 dated Apr. 4, 2023, 11 pages.

Notice of Allowance received for U.S. Appl. No. 16/926,876 dated Feb. 17, 2023, 7 pages.

Notice of Allowance received for U.S. Appl. No. 16/926,876 dated May 19, 2023, 7 pages.

Notice of Allowance received for U.S. Appl. No. 17/584,921 dated Jan. 19, 2023, 6 pages.

Notice of Allowance received for U.S. Appl. No. 17/584,921 dated May 5, 2023, 2 pages.

Office Action received for Chinese Patent Application Serial No. 202080057686 dated Feb. 28, 2023, 25 pages.

Requirement for Restriction received for U.S. Appl. No. 16/871,613 dated Apr. 4, 2023, 6 pages.

Bruno, G., et al., "Real Time Ellipsometry for Monitoring Plasma-Assisted Epitaxial Growth of GaN", Applied Surface Sci., vol. 253, 2006, pp. 219-223.

Bruno, James, "Use of Simulation for Examining the Effects of Guessing Upon Knowledge Assessment on Standardized Tests", "Conference Proceedings of the 10th Conference on Winter Simulation, Miami, FL", 1978, vol. 2, pp. 759-765.

Bryns, B., et al.., "A VHF Driven Coaxial Atmospheric Air Plasma: Electrical and Optical Characterization", Dep't of Nuclear Engr., 2011, pp. 1-18.

Buzzi, F.L., et al., "Energy Distribution of Bombarding Ions in Plasma Etching of Dielectrics", "AVS 54th International Symposium", Oct. 15, 2007, 18 pages.

Communication pursuant to Article 94(3) EPC received for European Patent Application Serial No. 10770205.2 dated Jun. 8, 2021, 6 pages.

Communication Pursuant to Article 94(3) EPC received for European Patent Application Serial No. 10770205.2 dated Oct. 23, 2020, 4 pages.

Decision of Rejection received for Chinese Patent Application Serial No. 201710704712.5 dated Aug. 10, 2020, 8 pages.

Decision of Rejection received for Korean Patent Application Serial No. 1020137019332 dated Jan. 20, 2016, 6 pages.

Emsellem, G., "Electrodeless Plasma Thruster Design Characteristics", 41st Joint Propulsion Conference, Jul. 11, 2005, 22 pages.

European Search Report received for European Patent Application Serial No. EP11822326 dated Oct. 9, 2015, 3 pages.

Ferdous, Zannatul, Office action issued in U.S. Appl. No. 18/350,516, filed Mar. 20, 2025, 133 pages.

KIPO, Notice of Grounds for Rejection issued in Korean Patent Application No. 10-2022-7004812, Mar. 12, 2025, 15 pages.

PCT, International Preliminary Report on Patentability issued in PCT/US2023/073153, Mar. 13, 2025, 9 pages.

PCT, International Search Report and Written Opinion issued in PCT/US2024/055362, Jan. 14, 2025, 18 pages.

Yu, Yuechuan, Office Action issued in U.S. Appl. No. 18/318,861, filed Feb. 20, 2025, 102 pages.

Ford, Nathan K, Office Action issued in U.S. Appl. No. 17/401,422, filed Apr. 24, 2025, 100 pages.

PCT, International Search Report and Written Opinion issued in PCT/US2025/017119, Apr. 29, 2025, 20 pages.

Diop et al., 10 kV SiC MOSFET Evaluation for Dielectric Barrier Discharge Transformerless Power Supply, Aug. 18, 2020, Plasma, vol. 3, No. 3, pp. 103-116.

EPO, Extended European Search Report issued in EP Application No. 22856600.6, May 12, 2025, 9 pages.

KIPO, Notice of Grounds for Rejection issued in KR Application No. 10-2022-7042658, Jul. 10, 2025, 26 pages.

Rueda et al., Series Resonant Inverter Efficiency Improvement with Valley Switching for Dielectric Barrier Discharges, IEEE 2019 IEEE 13th International Conference Onpower Electronics and Drive Systems, Toulouse, France, Jul. 9-12, 2019, 6 pages.

Skibinski, Tomi Sweet, Office Action issued U.S. Appl. No. 18/656,543, filed May 15, 2025, 33 pages.

Final Office Action received for U.S. Appl. No. 18/670,168 dated Sep. 11, 2025, 6 pages.

International Preliminary Report on Patentability received for PCT Patent Application No. PCT/US2024/011334, mailed on Jul. 24, 2025, 7 pages.

International Search Report and Written Opinion received for International PCT Application Serial No. PCT/US2022/053703, Apr. 6, 2023, 10 Pages.

International Search Report and Written Opinion received for PCT Patent Application No. PCT/US2025/040171, mailed on Oct. 8, 2025, 17 pages.

Lee, Jye-June, Office Action issued in U.S. Appl. No. 18/742,088, filed Jan. 16, 2025, 36 pages.

Non-Final Office Action received for U.S. Appl. No. 18/518,840 mailed on Sep. 23, 2025, 9 pages.

Non-Final Office Action received for U.S. Appl. No. 18/670,168 dated Aug. 29, 2025, 5 pages.

Notice of Allowance received for JP Patent Application Serial No. 2022-568414, dated Jul. 29, 2025, 4 pages.

Office Action received for European Application No. 24742051.6, mailed on Aug. 20, 2025, 3 pages.

Office Action received for Japanse Patent Application No. 2024-215046, mailed on Jun. 26, 2025, 3 pages (2 pages of original office action and 1 page of English Translation).

PCT, International Preliminary Report on Patentability issued in PCT/US2022/040046, Feb. 22, 2024, 8 pages.

* cited by examiner

FIG. 3

PLASMA BEHAVIORS PREDICTED BY CURRENT MEASUREMENTS DURING ASYMMETRIC BIAS WAVEFORM APPLICATION

BACKGROUND

Field of the Disclosure

The present disclosure relates generally to plasma processing. More specifically, but without limitation, the present disclosure relates to monitoring and analyzing current flow information for predicting plasma behavior in a plasma processing chamber.

Background

Many types of semiconductor devices are fabricated using plasma-based etching techniques. If it is a conductor that is etched, a negative voltage with respect to ground may be applied to the conductive substrate to create a substantially uniform negative voltage across the surface of the substrate conductor, which attracts positively charged ions toward the conductor, and as a consequence, the positive ions that impact the conductor have substantially the same energy.

If the substrate is a dielectric, however, a non-varying voltage is ineffective to place a voltage across the surface of the substrate. But an alternating current (AC) voltage (e.g., high frequency AC or time varying periodic voltage waveform may be applied by a bias supply to the conductive plate (or chuck) so that the AC field induces a voltage on the surface of the substrate. During a negative portion of the applied waveform, the surface of the substrate will be charged negatively, which causes ions to be attracted toward the negatively-charged surface during the negative portion of the periodic cycle. And when the ions impact the surface of the substrate, the impact dislodges material from the surface of the substrate—effectuating the etching.

During operation of a bias supply, the bias supply undergoes state changes, and the periodic waveform may by changed, consistent with state changes, to effectuate different ion energy distribution functions (IEDFs). For example, directionality, feature profile, and selectivity to a mask and a stop-layer may be controlled by making state changes to the bias supply to adjust the IEDF.

In some circumstances, a particular distribution of ion energies (or IEDF) may be desired, which may require accurate control of the sheath voltage ($V_{sheath}$), which generally refers to the potential difference (or voltage drop) from the plasma to the substrate surface. A bias power system may be utilized to control the voltage drop across the sheath in plasma processing systems in order to control the distribution of ion energies to a substrate.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Some aspects may be characterized as a biasing system including: an output node; a bias supply configured to apply an asymmetric periodic voltage waveform and provide a corresponding current waveform at the output node wherein the asymmetric periodic voltage waveform includes: a first section that begins with a first negative voltage and changes to a peak voltage before changing to a second negative voltage; and a second section that begins with the second negative voltage and includes a voltage ramp between the second negative voltage and a third negative voltage; and a metrology module configured to receive data about the current waveform during the first section and provide information about a plasma load when the bias supply is coupled to the plasma load.

Other aspects may be characterized as a method for predicting plasma behavior, including: applying an asymmetric periodic voltage waveform to a plasma processing chamber, the asymmetric periodic voltage waveform including: a first section that begins with a first negative voltage and changes to a second, peak voltage before changing to a second negative voltage; and a second section that begins with the second negative voltage and includes a voltage ramp between the second negative voltage and a third negative voltage; and providing a current waveform that corresponds to the asymmetric periodic voltage waveform; measuring the current waveform while the first section of the asymmetric periodic voltage waveform is applied; and providing, using the measurements of the current during the first section, information about a plasma load.

Yet other aspects relate to a non-transient computer-readable storage medium having instructions embodied thereon, the instructions are executable by a processor and/or capable of programming a field programmable gate array, the instructions including instructions for: applying an asymmetric periodic voltage waveform at an output node of a bias supply, the asymmetric periodic voltage waveform including: a first section that begins with a first negative voltage and changes to a second, peak voltage before changing to a second negative voltage; a second section that begins with the second negative voltage and includes a voltage ramp between the second negative voltage and a third negative voltage; and providing a current waveform that corresponds to the asymmetric periodic voltage waveform; measuring the current waveform while the first section of the asymmetric periodic voltage waveform is applied; and providing, using the measurements of the current during the first section, information about a plasma load.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of 'a', 'an', and 'the' include plural referents unless the context clearly dictates otherwise.

BRIEF DESCRIPTION OF THE DRAWINGS

FIG. 3 is a schematic diagram electrically representing aspects of a plasma processing chamber, according to various aspects of the disclosure.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments. In this regard, some blocks in these flowcharts or block diagrams may represent a module, segment, or portion of code, which comprises one or more executable instructions for implementing the specified logical function(s). The instructions may be executable by a processor or may be used to program a field programmable gate array. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

For the purposes of this disclosure, "source generators" or "excitation supplies" are those whose energy is primarily directed to generating and sustaining the plasma, while "bias supplies" are those whose energy is primarily directed to generating a surface potential for attracting ions and electrons from the plasma. As used herein, the terms "workpiece", "substrate", "wafer", or "wafer substrate" may be used interchangeably throughout the disclosure.

As discussed above, bias supplies may be used to apply an asymmetric periodic voltage function (also referred as an asymmetric periodic voltage waveform) to a substrate support in a plasma processing chamber. As disclosed herein, characteristics of a plasma load may be deduced by measuring a corresponding current waveform—the current waveform produced based at least in part on applying the asymmetric periodic voltage waveform to a substrate support. As used and described in more detail herein, the term plasma load refers to the electrical impedance presented to a bias supply.

Figure 1:
FIG. 1 is a block diagram depicting an exemplary plasma processing environment utilizing one or more bias supplies, according to various aspects of the disclosure.
Figure 1:
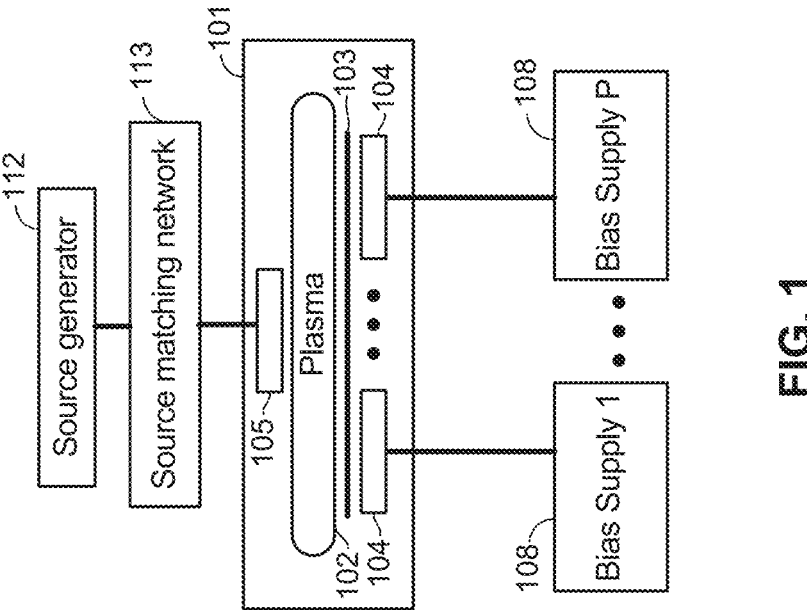

Referring first to FIG. 1, shown is an exemplary plasma processing environment 100, such as a deposition or etch system, in which one or more bias supplies may be utilized. The plasma processing environment 100 may include many pieces of equipment coupled directly and indirectly to a plasma processing chamber 101, within which a volume containing a plasma 102 and workpiece 103 (e.g., a wafer or substrate) and electrodes 104 (which may be embedded in a substrate support) are contained. The equipment may include vacuum handling and gas delivery equipment (not shown), one or more bias supplies 108, one or more source generators 112, and one or more source matching networks 113. In many applications, power from a single source generator 112 is connected to one or multiple source electrodes 105. The source generator 112 may be a higher frequency RF generator (e.g., 13.56 MHz to 120 MHz). The electrode 105 generically represents what may be implemented with an inductively coupled plasma (ICP) source, a dual capacitively-coupled plasma source (CCP) having a secondary top electrode biased at another RF frequency, a helicon plasma source, a microwave plasma source, a magnetron, or some other independently operated source of plasma energy. Although not shown in FIG. 1, It should also be recognized that a bias supply 108 may also be coupled to the electrode 105 in a CCP configuration where combined source and bias energy is directed to a single electrode.

In variations of the system depicted in FIG. 1, the source generator 112 and source matching network 113 may be replaced by, or augmented with, a remote plasma source. And other variations of the system may include only a single bias supply 108. It should be recognized that many other variations of the plasma processing environment depicted in FIG. 1 may be utilized. As examples without limitation, U.S. Pat. No. 10,707,055, issued Jul. 7, 2020, and U.S. Pat. No. 10,811,227, issued Oct. 20, 2020, both of which are incorporated by reference in their entirety, disclose various types of system designs.

It should also be recognized that, while the following disclosure generally refers to plasma-based workpiece processing, implementations can include any substrate processing within a plasma chamber. In some instances, objects other than a substrate can be processed using the systems, methods, and apparatus herein disclosed. In other words, this disclosure applies to plasma processing of any object within a sub-atmospheric plasma processing chamber to make a surface change, subsurface change, deposition or removal by physical or chemical means.

In some examples, the present disclosure also relates to predicting plasma behaviors based on monitoring and analyzing current flow information (e.g., ion current flow information) available from a bias supply. In some cases, the bias supply is configured to apply an asymmetric bias waveform to the substrate or wafer surface, as described in more detail below.

Currently used techniques often apply a rudimentary direct-current (DC) pulsed waveform, or alternatively, a time-varying radio frequency (RF) signal, such as a sinusoidal waveform, as a substrate bias. The rudimentary pulsed waveforms result in an undesirable and difficult-to-control spread of ion energies. And an RF bias (e.g., a sinewave bias) produces a time-varying substrate voltage that results in an ion energy distribution that may include multiple concentrations of ion energies. Moreover, the currently used techniques lack the ability to provide useful information about the environment within the plasma chamber 101.

Figure 4:
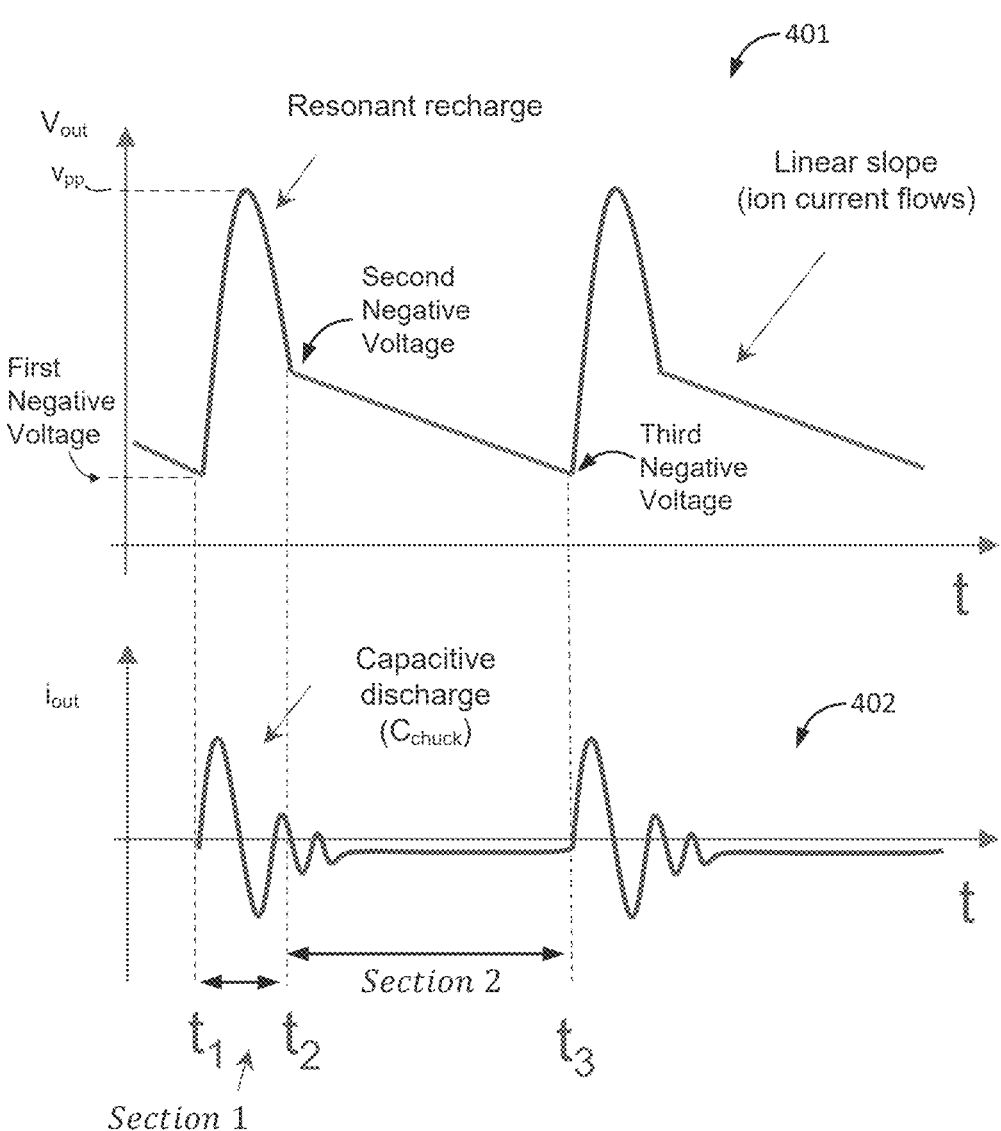
FIG. 4 depicts conceptual graphs of voltage and current waveforms generated by a bias supply, according to various aspects of the disclosure.

In contrast, asymmetric waveforms of the present disclosure alleviate one or more of the issues seen in the prior art, most notably, the broad, uncontrolled ion energy distributions commonly associated with basic DC pulsing and sinewaves. FIG. 4, discussed further herein, illustrates one example of an asymmetric waveform that can be generated by the bias supplies of the present disclosure. Moreover, Applicant has found that the current associated with the asymmetric periodic waveform provides extractable information that is useful for reporting about aspects of the plasma chamber environment and/or useful as feedback for controlling the bias supplies 108.

Figure 2:
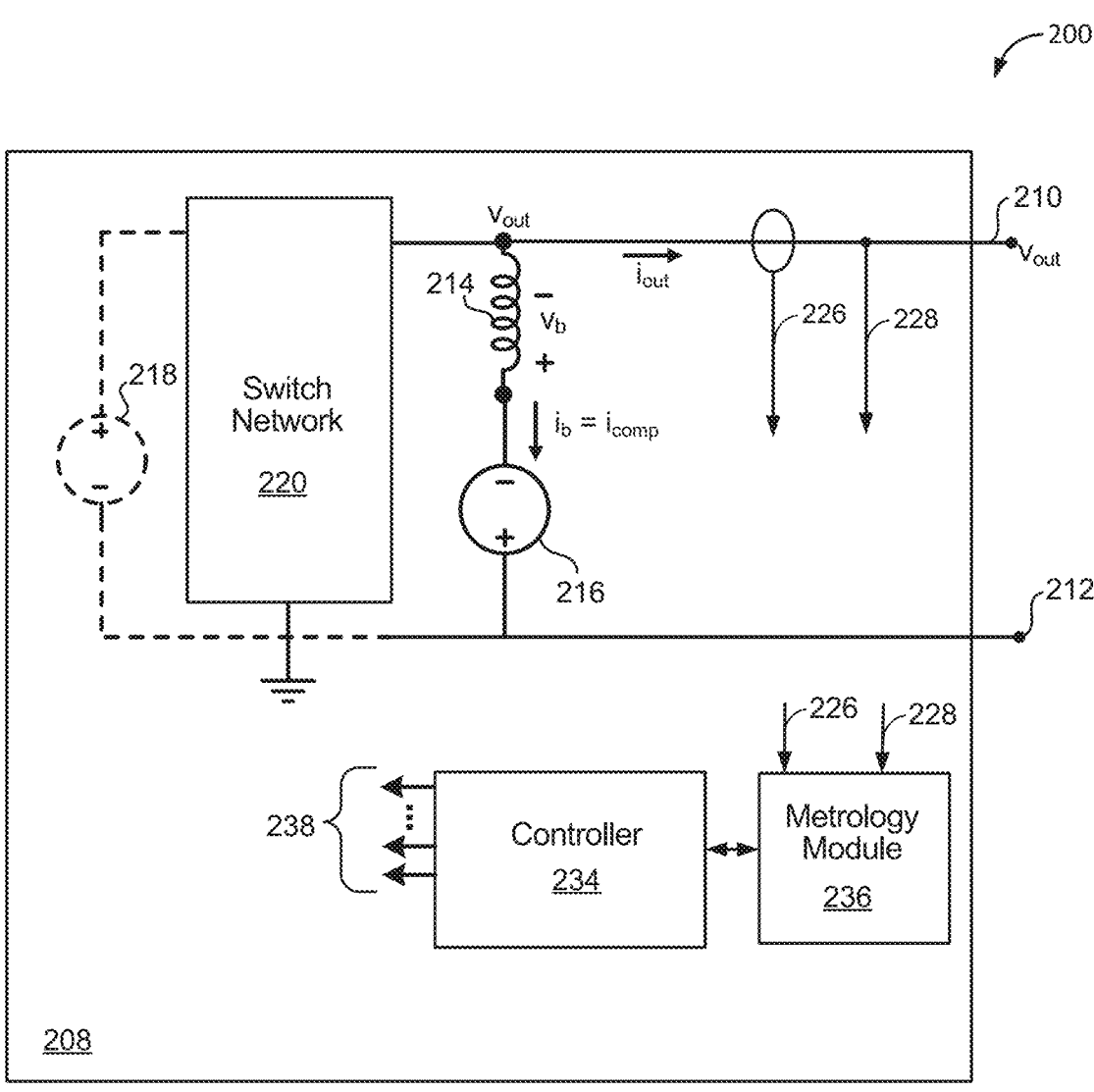
FIG. 2 is a schematic diagram depicting an example of a bias supply, according to various aspects of the disclosure.

Referring to FIG. 2, shown is a biasing system 200 comprising an exemplary bias supply 208 that may be utilized to implement the bias supplies 108 described with reference to FIG. 1. The bias supply 208 generally represents many variations of bias supplies described further herein to apply an asymmetric periodic voltage function (or asymmetric periodic waveform). Thus, reference to the bias supply 208 generally refers to any of the bias supplies described further herein. As shown, the bias supply 208 includes an output node 210 (also referred to as an output 210), an optional return node 212, a switch network 220, and a series combination of an inductance 214 and a first power supply 216 (also referred to as herein as $V_{supply}$ 216) that is coupled between the output node 210 and the return node 212. Also shown is an optional second power supply 218 (also referred to herein as $V_{rail}$ 218). In general, the bias supply 208 functions to apply an asymmetric periodic voltage function at the output node 210. Output current, $i_{out}$, delivered to a load through the output node 210 may optionally be returned to the bias supply 208 through the return node 212 that may be common with the load.

FIG. 2 also depicts examples of electrical parameters that are associated with the bias supply 208 including an inductor voltage, $V_b$, that is a voltage across the inductance 214, which may be measured as the voltage between the output node 210 and the negative node of the first power supply 216. In addition, inductance current, $i_b$, that flows through the inductance 214 may be measured along the current path that includes the inductance 214 and the first power supply 216. Yet another electrical parameter that may be measured is output current, $i_{out}$, which may be measured along a current path, as shown, between the switch network 220 and the output node 210. In addition, the output voltage, $v_{out}$, is another electrical parameter that may be measured and utilized as described herein. For example, $v_{out}$ may be the voltage (or potential difference) between the output node 210 and the return node 212, or as another example, $v_{out}$, may be the voltage (or potential difference) between the output node 210 and ground. As described herein, the return node 212 may be grounded in some variations of the bias supply 208 or may be another non-zero voltage. It should be recognized that other electrical parameters of the bias supply 208 may be monitored and/or measured depending upon the particular design of the bias supply 208.

As shown, the bias supply 208 may include a controller 234 that functions to control the first power supply 216, the second power supply 218, and/or the switch network 220 based upon one or more of the electrical parameters (e.g., $i_b$, $v_b$, $i_{out}$, and $v_{out}$, to name a few). The controller 234 may reside within a housing of the bias supply 208, or alternatively, may reside external to the housing of the bias supply 208. When implemented external to the housing of the bias supply 208, the controller 234 may be implemented as a portion of a centralized controller that controls several pieces of processing equipment such as, for example and without limitation, the bias supply 208, the source generator (e.g., shown as source generator 112 in FIG. 1), the source matching network 113, the switch network 220, other bias supplies (e.g., shown as bias supplies 108 in FIG. 1), mass flow controllers, and other applicable components. The controller 234 may also be distributed between the bias supply 208 and control-related components that are external to the bias supply 208. It is also contemplated that the controller 234 may be implemented within a housing of another piece of equipment such as the source generator, such as source generator 112 in FIG. 1, or the controller 234 may be implemented as a distributed controller that resides in several pieces of equipment.

As shown, the controller 234 is in communication with a metrology module 236. The depiction of the metrology module 236 is logical for purposes of describing functional aspects of the controller 234 and the metrology module 236, but is should be recognized that the controller 234 and the metrology module 236 may be realized by common underlying hardware and/or software/firmware constructs. For example, the controller 234 and the metrology module 236 may share one or more common processors and/or field programmable gate arrays (FPGAs). As one of ordinary skill in the art will appreciate, dedicated hardware constructs, processor executable instructions and/or instructions to program an FPGA may be utilized to effectuate control methods described further herein.

As shown, the metrology module 236 may receive one or more signals including a current signal 226 indicative of the output current, $i_{out}$, and voltage signals 228 indicative of the output voltage, $v_{out}$. Although not shown in FIG. 2 for purposes of simplicity, those of ordinary skill in the art will readily appreciate that the output current, $i_{out}$ and output voltage, $v_{out}$ may be sensed by current and voltage sensors readily known in the art to produce the current signal 226 and voltage signal 228, and the current signal 226 and voltage signal 228 may be may be sampled and converted to produce digital representations of the current signal 226 and voltage signal 228. The controller 234 in conjunction with the metrology module 236 is configured to extract information about the plasma characteristics, and/or the plasma load generally, by analyzing the measurements of the current signal 226 and/or the voltage signal 228 along with any other relevant measurements. In some cases, these measurements are utilized as a means of feedback to the controller 234, and the controller 234 may adjust the output parameters (e.g., $i_{out}$, $v_{out}$) of the bias supply 208 based upon the feedback.

For example, the controller 234 is configured to control (by providing control signals) the switch network 220, the first power supply 216, and the second power supply 218 (when the second power supply is utilized) to effectuate desired aspects of the asymmetric, periodic voltage waveform (as described further herein) that is applied to the output node 210 and the optional return node 212. It is also contemplated that the extracted information about the plasma characteristics (provided by the metrology module 236) may be used to control the source generator 112 and/or the matching network 113.

Variations of the switch network 220 (and variations with and without the second power supply 218) are disclosed further herein in relation to FIGS. 8A-8D, but first, it is helpful to understand aspects of plasma characteristics as indicated by parameter values, obtained by the metrology module, relating to an electrical impedance (referred to herein as the plasma load) presented to the bias supply 208.

Figure 3:
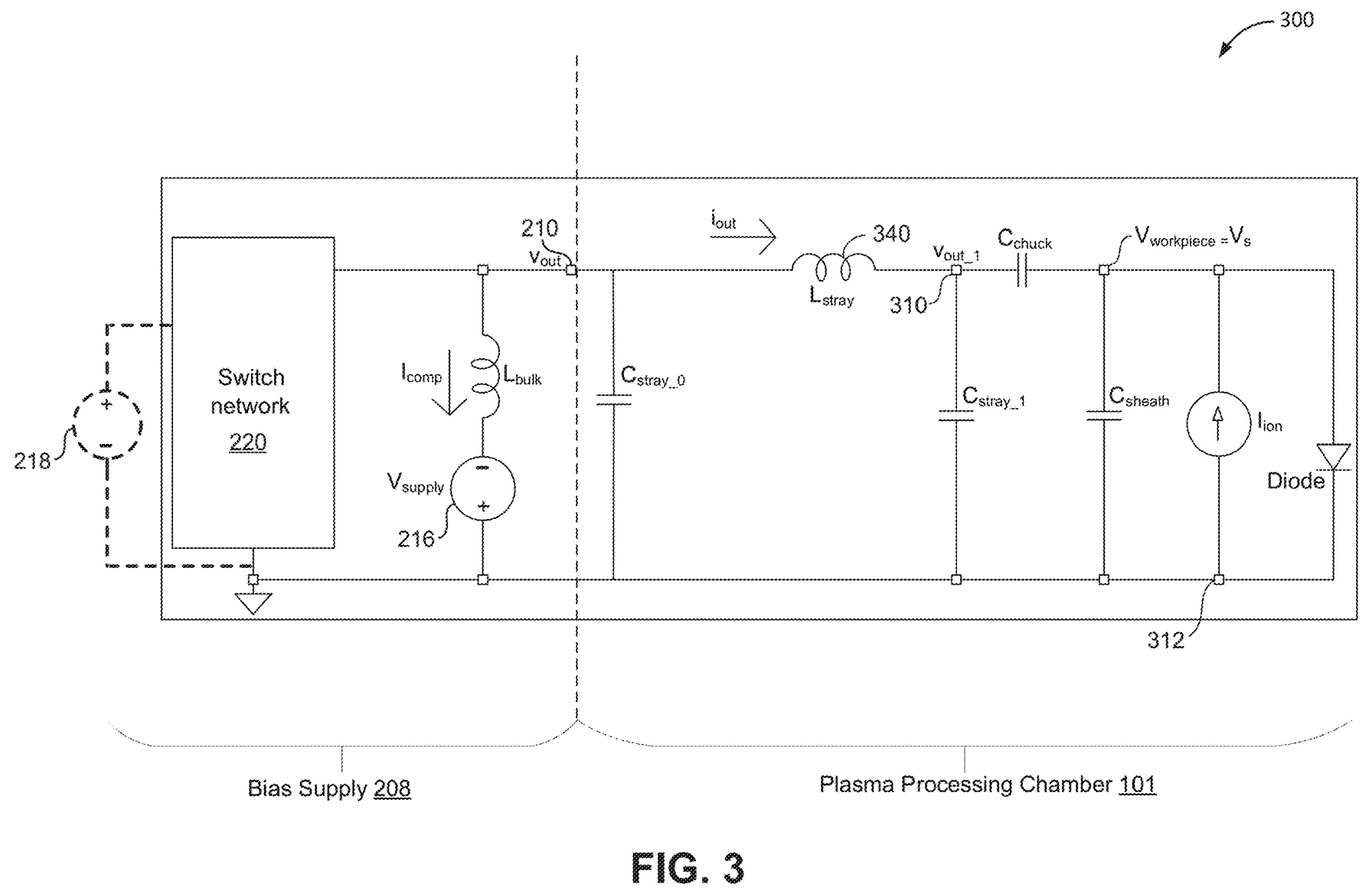

Turning now to FIG. 3, which illustrates a schematic drawing 300 that electrically depicts lumped components (e.g., lumped inductive and capacitive components) between the output node 210 of a bias supply 208 and an input 310 of a plasma processing chamber 101 according to various aspects of the disclosure. Also shown are aspects of the plasma processing chamber 101 that contribute to a plasma load experienced by the bias supply 208 that may be represented by a chuck capacitance $C_{chuck}$ (that includes a capacitance of a chuck and workpiece, such as workpiece 103 shown in FIG. 1) that is positioned between an input 310 (also referred to as an input node 310) to the plasma processing chamber 101 and a node representing a sheath voltage, $V_s$, at a surface of the workpiece 103 (which may be a wafer or substrate). As a consequence, references to the sheath voltage, $V_s$, are also referred to as a voltage at a surface of the workpiece 103 (shown as $V_{workpiece}$ in FIG. 3). In addition, an optional return node 312 (which may be a connection to ground) is depicted. The plasma (shown as plasma 102 in FIG. 1) in the processing chamber 101 is represented by a parallel combination of a sheath capacitance, $C_{Sheath}$, a diode, and a current source, $I_{ion}$. The diode represents the non-linear, diode-like nature of the plasma sheath that results in rectification of the applied AC field, such that a direct-current (DC) voltage drop, appears between the workpiece 103 and the plasma 102.

FIG. 3 also depicts a lumped-element inductance 340 (also referred to as stray inductance or $L_{stray}$ 340) representing inductive elements between the output node 210 of the bias supply 208 and the input node 310 to the plasma chamber 101. In many implementations, the digital representations of the asymmetric periodic voltage waveform (e.g., output by a metrology module 720 may be adjusted, e.g., by a data processing module 730 as discussed further herein with reference to FIG. 7), to compensate for $L_{stray}$ 340 to obtain an adjusted digital representation of the asymmetric periodic voltage waveform. This adjustment for the stray inductance 340 (or $L_{stray}$ 340) enables one or more of a step voltage $V_{step}$ (shown in FIGS. 5 and 6) at the input 310 to the plasma chamber, a workpiece voltage value, $V_{workpiece}$, and or anion energy value $E_{ion}$ (shown in FIGS. 5 and 6) to be calculated at the bias supply 208. U.S. patent application Ser. No. 17/584,921, entitled BIAS SUPPLY CONTROL AND DATA PROCESSING, filed Jan. 26, 2022 is incorporated herein by reference for all purposes including its teaching of compensating for $L_{stray}$ 340.

As seen, FIG. 3 also depicts one or more lumped-element capacitances, $C_{stray\_0}$, $C_{stray\_1}$. In this example, $C_{stray\_0}$ is a lumped-element capacitance representing the capacitance from an output node 210 of the bias supply 208 to the return node 312, while $C_{stray\_1}$ is a lumped-element capacitance representing the capacitance from an input node 310 of the processing chamber 101 to the return node 312. In some cases, one or more of the $C_{stray\_0}$ and $C_{stray\_1}$ lumped-element capacitances may include a capacitance of a connector and filter capacitance.

FIG. 4 illustrates conceptual graphs 401 and 402 of voltage and current waveforms, respectively, generated during operation of the bias supply 208 according to various aspects of the disclosure. For example, the $v_{out}$ and $i_{out}$ waveforms shown in FIG. 4 correspond to the output voltage and output current waveforms, respectively, at output node 210 of the bias supply 208 in FIGS. 2 and 3. In one non-limiting example, the voltage and current waveforms may be generated during operation of a bias supply 208 comprising a switch network having a single-switch topology, such as the ones described further herein with reference to FIGS. 8B and/or 8D.

As seen, the $v_{out}$ and $i_{out}$ waveforms in FIG. 4 can be split into two sections (e.g., Section 1 and Section 2). Here, the first section (or Section 1) spans from time $t_1$ to $t_2$, while the second section (or Section 2) spans from time $t_2$ to $t_3$. Section 1 may be characterized by a resonant release of stored energy in the system (or plasma processing environment). The release of resonant energy may produce a measurable alternating current at the output node 210, where the resonant energy is based at least in part on the charge stored in the chuck capacitance, $C_{chuck}$, depicted in FIG. 3. In some cases, the total charge stored in the chuck capacitance, $C_{chuck}$, is based on the ion current flowing from the plasma 102 to a surface of the workpiece 103. Specifically, the chuck capacitance, $C_{chuck}$, is charged as a result of the ion current flowing from the plasma 102 to the surface of the workpiece 103 during the second section (i.e., Section 2 spanning from time $t_2$ to $t_3$) of the asymmetric periodic voltage waveform. Because $C_{chuck}$ is continuously charging (by attracting positive ions) during Section 2, $C_{chuck}$ must be discharged periodically during Section 1 to avoid an overvoltage condition. By applying a positive voltage pulse (reaching Vpp), $C_{chuck}$ is discharged by attracting electrons in the plasma 102, which may result in the release of the resonant energy that produces the alternating current in Section 1.

As shown in FIG. 4, each cycle of the asymmetric, periodic voltage waveform comprises the first section (Section 1) that begins with a first negative voltage and changes to a positive peak voltage, Vpp, during the first section. Further, at or near the end of the first section, the asymmetric, periodic voltage starts dropping from the positive peak voltage level, such that it is at a second negative voltage at the beginning of Section 2. During Section 2, the asymmetric, periodic voltage waveform comprises a voltage ramp (also referred to as a negative voltage ramp) between the second negative voltage and the third negative voltage. Although the voltage ramp may be linear, it should be recognized that the voltage ramp may also be nonlinear. Depending upon a desired processing result, the first negative voltage may be the same as, or may be different than, the third negative voltage over several cycles of the asymmetric periodic voltage waveform.

FIG. 4 also shows the variation of the output current, $i_{out}$, against time over each cycle. In some cases, the waveform of the output current, $i_{out}$, is also asymmetric and periodic. During Section 1 of the cycle, the output current waveform oscillates as a result of the capacitive discharge of the chuck capacitance, $C_{chuck}$. At the beginning of Section 2 of the cycle, the magnitude of the output current, $i_{out}$, is significantly lower than the peak current level seen in Section 1. In some examples, the output current, $i_{out}$, oscillates one or more times within Section 2 of the cycle before reaching a point where the ringing has decayed to a substantially steady-state value. Although there may be some residual ringing, as seen in FIG. 4, this substantially steady-state value is maintained for the majority of Section 2 (spanning from time $t_2$ to $t_3$) of the cycle before it starts ramping up at the start of the next cycle.

Several aspects of the present disclosure are directed to measuring the output current ($i_{out}$) flow during the capacitive discharge for deducing the characteristics of the plasma load in the plasma processing chamber 101. In one non-limiting example, the output current during the chuck capacitance, $C_{chuck}$, discharge event may be integrated to determine the total charge released from the $C_{chuck}$ capacitance. In some cases, the total charge released from the chuck capacitance combined with a temporal understanding of a flow of the output current, $i_{out}$, may be used to deduce the time-averaged ion current during Section 2 of the asymmetric periodic voltage waveform. Similarly, by determining various aspects of the output current, $i_{out}$, (e.g., the resonant frequency in the AC portion, or time taken for the chuck capacitance to fully discharge) from cycle to cycle may help offer insight into the sheath behavior over multiple cycles. In some other cases, the various aspects of the output current, $i_{out}$, may be sampled and the samples may be compared overtime to gain insight into the sheath behavior over a broader time scale (e.g., intra-run or run-to-run variability). Additionally, or alternatively, the measurements described above may also be used to compare performance and/or variability across multiple systems (e.g., plasma processing environments), plasma bulk properties, or chamber to chamber matching. Samples of the output current, $i_{out}$, collected individually or over time may be used to establish a baseline condition for use as reference in assessment of repeatability or as indication of drift or change to the chamber or process condition over time. Further, samples collected individually or over time can similarly be used as reference for assessing the degree of chamber matching or chamber mis-match across a collection of chambers. It should also be noted that in multi-electrode systems, the measurements of output current, $i_{out}$, may be additionally or alternatively be used to monitor operation and/or conditions between electrodes, e.g., for the purpose of process optimization or process repeatability and/or control.

Figure 5:
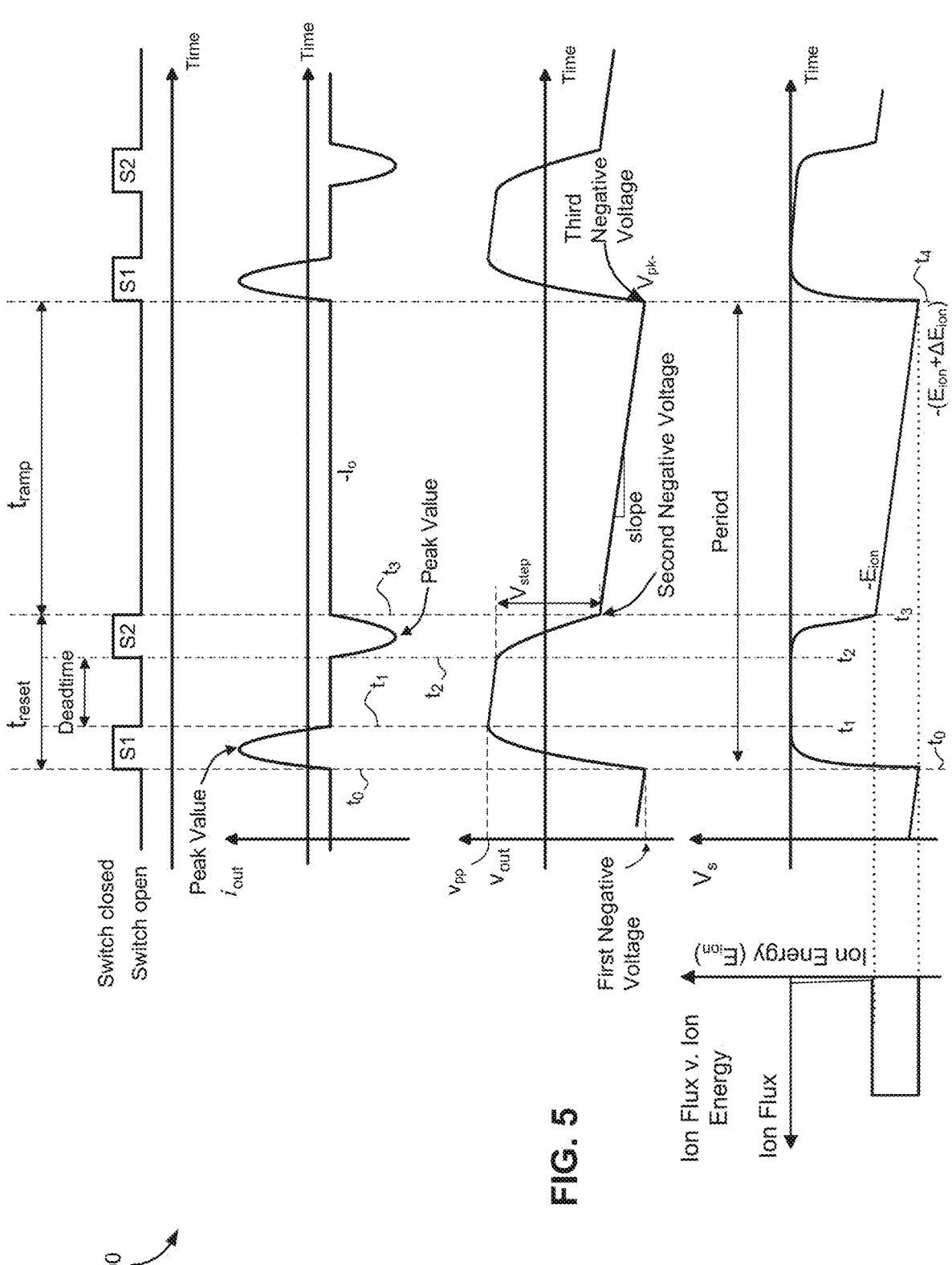
FIG. 5 depicts conceptual graphs and a timing diagram showing aspects of a bias supply comprising two switches, according to various aspects of the disclosure.
Figure 6:
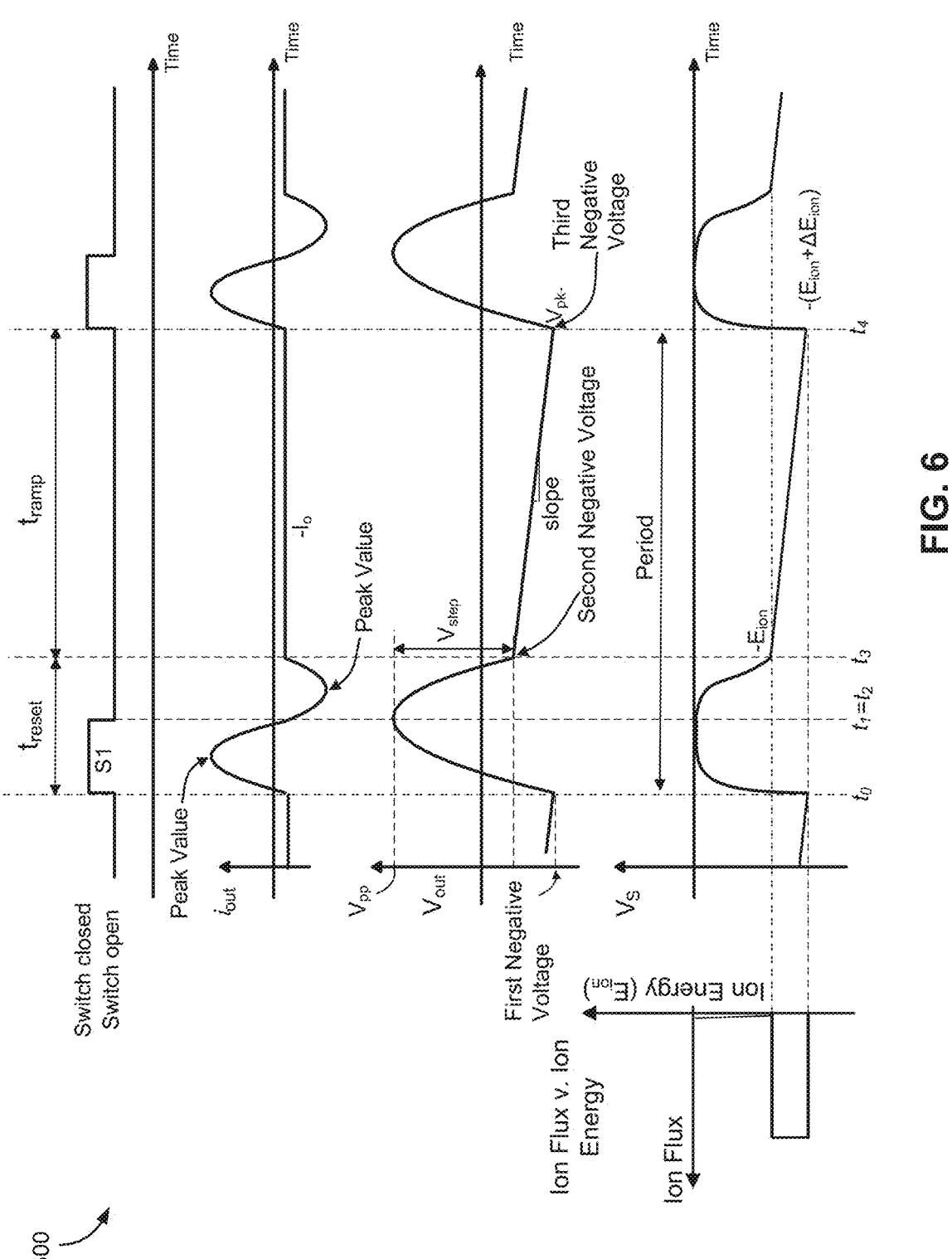
FIG. 6 depicts conceptual graphs and a timing diagram showing aspects of a bias supply comprising a single switch, according to various aspects of the disclosure.

Referring next to FIGS. 5 and 6, shown are timing diagrams 500 and 600, respectively, associated with implementations of the bias supplies 208 that have two switches and one switch, respectively. Each of FIGS. 5 and 6 show an asymmetric periodic voltage waveform ($v_{out}$) and a corresponding current waveform ($i_{out}$). As depicted in FIG. 5, the bias supplies 208 disclosed herein operate to apply a cycle of an asymmetric periodic voltage waveform, $V_{out}$, at the output node 210 of the bias supply 208 from time $t_0$ to $t_4$. As shown, the asymmetric periodic voltage waveform, $v_{out}$, comprises Section 1 that begins with a first negative voltage and changes to a second, peak voltage, Vpp, before changing to a second negative voltage at $t_3$. The asymmetric periodic voltage waveform, $v_{out}$, also comprises Section 2 that begins with the second negative voltage and comprises a voltage ramp between the second negative voltage and a third negative voltage level. It should be noted that although the first negative voltage and the third negative voltage are separately identified, the first negative voltage and the third negative voltage may be the same voltage.

The asymmetric periodic voltage waveform, $v_{out}$, may also be characterized in terms of relevant voltage portions, and the measured current flow during the capacitive discharge of Section 1 may be used to deduce characteristics of the plasma 102 (or more generally, the plasma load) that may be used for monitoring, reporting, and as a means of feedback for control over output parameters of the bias supply 208 (e.g., the various voltage and current parameters identified above and below in connection with FIGS. 4, 5 and 6). As shown, the asymmetric periodic voltage waveform, $v_{out}$, comprises a first portion (from time $t_0$ to $t_1$) that begins with the first negative voltage and changes to a positive peak voltage, Vpp, (at time $t_1$) at or near the end of the first portion.

The asymmetric periodic voltage waveform, $v_{out}$, may also change from the peak positive voltage level, Vpp, to a second positive voltage level at time t2 during a second portion (from time $t_1$ to $t_2$), where the second positive voltage level is slightly below the peak voltage level, Vpp, and Vpp may be adjusted based upon the measured current flow during the capacitive discharge of Section 1. At or near the end of the second portion, the asymmetric periodic voltage waveform, $v_{out}$, drops by a step voltage ($V_{step}$) such that itis at the second negative voltage (at time $t_3$). That is, during the third portion (from time $t_2$ to $t_3$) the asymmetric periodic voltage waveform drops by the step voltage, $V_{step}$, to the second negative voltage at $t_3$. As shown in FIGS. 5 and 6, the voltage step, $V_{step}$, between times $t_2$ and $t_3$, corresponds to a sheath voltage, $V_s$, at $t_3$ that produces ions at an energy level, $-E_{ion}$. Because an energy level of ions is a function of $V_{step}$, $V_{step}$ is a parameter that may be used as a setpoint in some embodiments of the bias supply system 200, and $V_{step}$ may be adjusted based upon the measured current flow during the capacitive discharge of Section 1.

As shown, the asymmetric periodic voltage waveform also comprises a fourth portion (from time $t_3$ to $t_4$), where the fourth portion includes a negative voltage ramp between the second negative voltage level at $t_3$ and the third negative voltage level (also referred to as Vpk–) at $t_4$. One or more aspects of the negative voltage ramp (e.g., slope or duration) may also be adjusted based upon the measured current flow during the capacitive discharge of Section 1. As seen, at time $t_4$, the asymmetric periodic voltage waveform, $V_{out}$, is at the peak negative voltage, $V_{pk-}$, where the peak negative voltage may have the same or similar magnitude as the first negative voltage at the start of the cycle (i.e., at $t_0$). Depending upon the slope of the negative voltage ramp (between $t_3$ and $t_4$), the sheath voltage, Vs, may or may not change between times $t_3$ and $t_4$, and when the sheath voltage, Vs, varies between $t_3$ and $t_4$, the distribution of ion energies varies beyond the ion energy established by $V_{step}$ so that ion energy distribution covers a broader range of ion energies (e.g., covering $-Eion+\Delta Eion$).

Also shown in FIGS. 5 and 6 are times $t_{reset}$ (between times $t_0$ and $t_3$) and $t_{ramp}$ (between times $t_3$ and $t_4$). As shown, $t_{reset}$ covers a time that includes the first, second, and third portions ($t_0$ to $t_3$) of the asymmetric periodic voltage waveform, while $t_{ramp}$ includes the fourth portion ($t_3$ to $t_4$). In many modes of operation, frequency of the asymmetric periodic voltage waveform may be controlled (based upon the measured current flow during the capacitive discharge of Section 1) to control $t_{ramp}$.

FIGS. 5 and 6 also depict the peak negative voltage, $V_{pk-}$, which identifies an end to the fourth portion of the asymmetric periodic voltage waveform. The negative voltage peak, $V_{pk-}$, may be used as a control parameter. For example, a threshold value for the negative voltage peak, $V_{pk-}$, may trigger the closing of switch S1 and opening of switch S2 (as shown in FIG. 5) or closing the single switch S1 that is controlled with reference to FIG. 6.

As shown in FIGS. 5 and 6, a full current cycle occurs between times $t_0$ and $t_4$ of the asymmetric periodic voltage waveform. Additionally, $t_{ramp}$ between $t_3$ and $t_4$ corresponds to the time between two adjacent full current cycles. An aspect of the present disclosure addresses the problem of how to adjust the output current, $i_{out}$, to compensate for the ion current, $I_{ion}$ (shown by way of the $I_{ion}$ current source in FIG. 3). Another aspect of the present disclosure addresses the problem of how to adjust a level of ion energies, $E_{ion}$, and distribution of the ion energies (IEDF) in the plasma processing chamber 101. Moreover, one or more aspects of the measured current flow during the capacitive discharge of Section 1 may also be used as a factor (or factors) when compensating for the ion current, $I_{ion}$, and/or when adjusting a level of ion energies, $E_{ion}$, and the distribution of the ion energies (IEDF).

As shown in FIG. 5, in variations of the bias supplies 208 that comprise two switches, the second portion of the asymmetric periodic voltage waveform may transition (during the time between time $t_1$ to $t_2$) to the third portion of the asymmetric periodic voltage waveform. And as shown in FIG. 6, in variations of the bias supplies 208 that comprise one switch, $t_1$ may equal $t_2$ and the first portion of the asymmetric periodic voltage waveform may end (and the second portion may start) at a positive peak voltage level ($V_{pp}$).

Further details of both single-switch and two-switch bias supplies are disclosed further herein in relation to FIGS. 8A-8D, but FIGS. 5 and 6 provide a reference for the various control methodologies and the various structural variations disclosed further herein. It should be recognized that the approaches taught herein for controlling output parameters of the bias supply 208 based upon the measured current during Section 1 of the asymmetric periodic voltage waveform are generally applicable to any topology regardless of the number of switches and power supplies. For example, some topologies known in the art use three or more switches and three or more power supplies to produce an asymmetric periodic voltage waveform. But the single-switch and the two-switch variations described herein provide examples that generally reflect more cost-effective approaches for adjusting the several parameters of the asymmetric voltage waveform and the corresponding current waveform.

Shown specific to FIG. 5 are a switching sequence of a first switch, S1, and a second switch, S2; output current, $i_{out}$, provided at the output node 210 of the bias supply 208; output voltage, $v_{out}$, at the output node 210 of the bias supply 208; and the sheath or wafer voltage, $V_s$-$V_{workpiece}$ (also shown in FIG. 3); and a corresponding ion energy distribution function (IEDF) depicted as ion flux versus ion energy.

As shown in FIG. 5, the first switch, S1, and the second switch, S2, may be controlled so that output current, $i_{out}$, completes a full current cycle between times $t_0$ and $t_3$. During a start of a current cycle at $t_0$, the output current, $i_{out}$, rises from a level $-I_o$, to reach a positive peak current value, and then the current is controlled to fall back to $-I_o$, at $t_1$. Then, at $t_2$, the output current, $i_{out}$, falls from the level $-I_o$, to increase in magnitude, to a peak value in an opposite direction (i.e., opposite from the positive peak current value to a negative peak current value) before decreasing back to $-I_o$ at $t_3$. More specifically, during the positive portion of the current cycle (when the first switch, S1, is closed and the second switch, S2, is open), the current increases to a peak positive value then decreases to $-I_o$. Additionally, during a negative portion (from time $t_2$ to $t_3$) of the full current cycle, the current increases to a negative value peak value then decreases to $-I_o$ This current in Section 1 (between $t_0$ and $t_3$) may be measured as discussed herein to obtain information about the plasma load.

As shown, in FIG. 5, the first switch, S1, and the second switch, S2, may be controlled with an adjustable deadtime, which is the time from $t_1$ to $t_2$ (after the switch, S1, is opened from a closed position and before S2 is closed).

As depicted in FIG. 5, controlling the deadtime enables $t_{reset}$ to be controlled. Furthermore, adjusting a ratio of $t_{reset}$ to $t_{ramp}$ helps adjust the peak voltages, currents, and average power supplied by the bias supply to the plasma processing chamber. In some cases, control over $t_{reset}$ also enables the fundamental switching frequency to be controlled (e.g., to remain below a level that affects plasma density in the plasma processing chamber 101).

Another aspect of control that may be achieved with the bias supply 208 disclosed herein is ion current compensation, $i_{comp}$. More specifically, the length of the deadtime, the length of $t_{ramp}$, and/or the period of the periodic voltage function (between $t_0$ and $t_4$) may be controlled to control a level of ion current compensation. In FIG. 5, $t_{ramp}$, the deadtime, and/or the level, $I_o$, may be controlled (if desired) so that ion current, $I_{ion}$, is compensated to a point where:

$$I_o = I_{ion} - (C_{chuck} + C_{stray\_1}) * \text{slope, and}$$

$$I_{comp} = I_{ion} - (C_{chuck} + C_{stray\_0} + C_{stray\_1}) * \text{slope,}$$

where "slope" corresponds to the slope of the output voltage, $V_{out}$, from $t_3$ to $t_4$. As discussed, integrating the current through the capacitive discharge event of Section 1 enables a determination of the total charge released from the $C_{chuck}$ capacitor, and this information combined with a temporal understanding of the current flow, may be used to deduce the time-averaged ion current during Section 2 of the waveform. This information may be used for reporting purposes and may also be used to adjust the ion current compensation, $i_{comp}$.

As shown in FIG. 5, when overcompensating for ion current, the sheath voltage $V_s$ (and the voltage at the surface of the workpiece 103 in FIG. 1) becomes increasingly negative between times $t_3$ and $t_4$ (i.e., during the $t_{ramp}$ time frame). In some cases, there is a distribution of ion energies as a result of the range of sheath voltages between $t_3$ and $t_4$. It should be recognized, however, that ion current may be undercompensated so that the sheath voltage $V_s$ (and the voltage at the surface of the workpiece 103) becomes less negative between times $t_3$ and $t_4$ (during the $t_{ramp}$ time frame). That is, under compensation of the ion current can result from a zero or roughly zero slope in $V_{out}$ during the $t_{ramp}$ time frame.

It is also possible to adjust the slope of the bias output voltage, $v_{out}$, between $t_3$ and $t_4$ so that the workpiece voltage, $V_{workpiece}$, and/or sheath voltage, $V_s$, is substantially constant between $t_3$ and $t_4$, which results in a very narrow distribution of ion energy (or narrow IEDF).

By adjusting both deadtime and tramp, the frequency of the asymmetric, periodic voltage waveform may be fixed if desired, but it is also possible to vary the deadtime, tramp, and the frequency of the asymmetric, periodic voltage waveform, vout. Itis also contemplated that the deadtime may be shortened while shortening or lengthening tramp, in some embodiments. Beneficially, measuring one or more aspects of the current during Section 1 of the asymmetric periodic voltage waveform enhances the available feedback information to control the switching parameters discussed above.

Referring to FIG. 6, shown are waveforms 600 depicting electrical aspects of the bias supply 208 and plasma processing chamber 101 when the switch network 220 is implemented with a single switch, according to various aspects of the disclosure. As shown in FIG. 5, the switch network (e.g., switch network 220 in FIG. 2) may be controlled so that the output current, $i_{out}$, completes a full cycle from a level −Io to a peak positive value, back to the level −Io, to a peak value in an opposite direction (i.e., to a peak negative value) and back to the level −Io. It should be recognized that the peak value of the current (e.g., peak positive value between t0 and t1=t2) in a first half of the current cycle may be different than the peak value of the current (e.g., negative peak value between t1=t2 and t3) in the second half of the current cycle.

Figure 7:
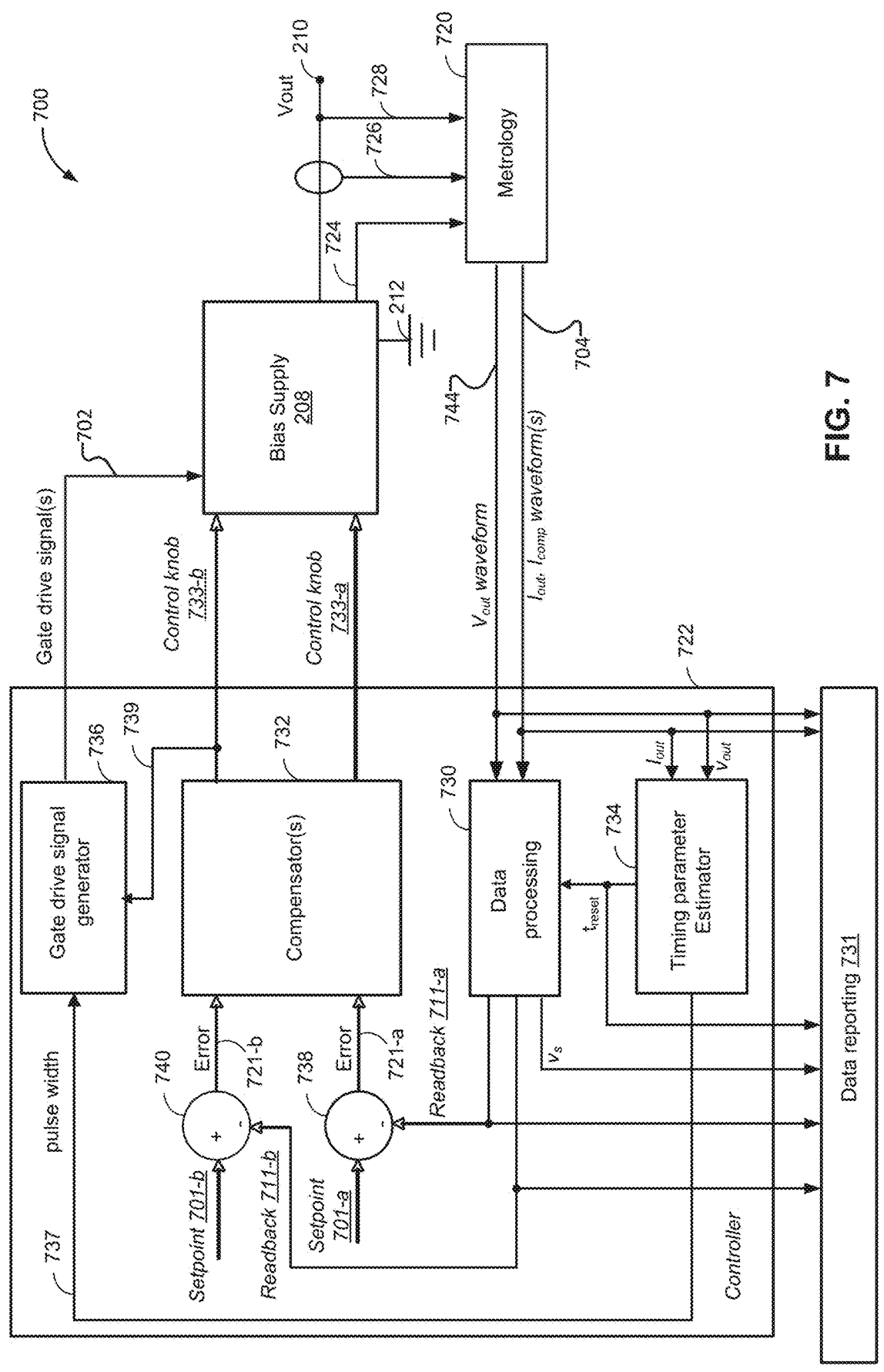
FIG. 7 is a block diagram depicting aspects of sampling, readback, and control of a bias supply, according to various aspects of the disclosure.

Referring next to FIG. 7, shown is a block diagram 700 depicting general aspects of metrology, readback, and control, according to various aspects of the disclosure. Shown are the bias supply 208, a metrology module 720, and a controller 722. In general, the metrology module 720 receives and samples signals indicative of power-related parameter values and provides a digital representation of the power-related parameter values to the controller 722. For example, the power-related parameters may include output current, $i_{out}$, provided to the output node 210, and output voltage, $v_{out}$, between the output node 210 and the return node 212. Although not required, the return node 212 may be a ground connection.

The metrology module 720 may receive and sample signals from one or more bias-supply-signal lines 724. The bias-supply signal lines 724 may convey signals indicative of bias-supply parameters such as compensation current ($I_{comp}$), temperature, and other parameters within the bias supply 208. A current-signal line 726 may provide analog signals from a current transducer that are indicative of output current, $i_{out}$, provided to the output node 210, and a voltage line 728 may provide analog signals that are indicative of the output voltage, $v_{out}$, at the output of the bias supply 208. In response to receiving the power-related signals (indicative of $i_{out}$ and $v_{out}$), the metrology module 720 samples and digitizes the power-related signals. For example, the metrology module 720 may provide complete digital representations of each entire cycle of the asymmetrical periodic voltage waveform, $v_{out}$; the output current, $i_{out}$, and/or $i_{comp}$.

An aspect of many variations of the metrology module 720 is that the complete voltage and current waveforms may be captured, which provides enhanced visibility of the output of the bias supply 208, information about a plasma load (e.g., when the output node 210 is coupled to the plasma load), and/or also facilitates enhancement of control aspects disclosed further herein.

As noted above, aspects of the present disclosure are directed to measuring the output current waveform, $i_{out}$, produced during the discharge of the chuck capacitance ($C_{chuck}$), which allows the characteristics of the plasma load in the plasma processing chamber to be deduced. In some cases, the switch network and the at least one power supply (e.g., $V_{supply}$) are configured, in combination, to apply an asymmetric periodic voltage waveform and provide a corresponding current waveform, $i_{out}$, at the output node. Further, the metrology module 720 may provide data about the current waveform at the output node to the metrology module 236. It should be recognized that the functionality of the metrology module 236 may be integrated with the data processing module 730 so that control of the bias supply 208 may be a function of the measured current during Section 1 and reporting (e.g., via component 731) may include information about one or more aspects of the current that is measured during Section 1. In some cases, the release of resonant energy stored in the plasma processing environment produces an AC current measurement at the output node 210, where the resonant energy is dependent on the charge stored in the chuck capacitance, $C_{chuck}$. The total charge stored in the chuck capacitance may further be related to the ion current based on other information provided by the metrology module 720. For example, a slope deviation factor, $K_S$, discussed below, may be used to relate total charge to the ion current flowing from the plasma to the wafer or substrate surface.

Although not required, the metrology module 720 may be realized in part by a field programmable gate array (FPGA), and the controller 722 may be realized by one or more processors that execute code stored in non-transitory media (to effectuate the functions of the controller 722). But other combinations of hardware, software, and firmware may be used to realize the metrology module 720 and the controller 722 in different embodiments.

As shown, the digital representations of the asymmetrical periodic voltage waveform, $v_{out}$; the output current, $i_{out}$ and/or $i_{comp}$ may be provided to a data reporting component 731. In some embodiments, the data reporting component 731 may comprise or may be electronically coupled to a user interface (e.g., a touchscreen display). In addition, the digital representations of the asymmetrical periodic voltage waveform, $v_{out}$; the output current, $i_{out}$ and/or $i_{comp}$ are provided to a data processing module 730, which may further process the digital representations of the asymmetrical periodic voltage waveform, $v_{out}$; the output current, $i_{out}$ and/or $i_{comp}$ to provide readback of one or more of sheath voltage, $V_s$, and one or more other parameter values such as $E_{ion}$, $V_{step}$, $\Delta E_{ion}$, output voltage slope (e.g., the slope of the asymmetrical periodic voltage waveform between times $t_3$ and $t_4$), and/or a slope deviation factor, $K_s$.

The slope deviation factor, $K_s$, may be calculated as:

$$K_s = \frac{C_{chuck}}{C_{chuck} + C_{stray1}} \times \frac{\text{Slope}_w}{\text{Slope}}$$

where $\text{Slope}_w$ is the slope from time $t_3$ to $t_4$ of the wafer/sheath voltage.

In the alternative, the slope deviation factor, $K_s$, may be calculated such that it satisfies the following equation:

$$(1 - K_s)\left(1 + \frac{C_{stray1}}{C_{chuck}}\right) \cdot \text{Slope} + \frac{I_o}{C_{chuck}} = 0$$

The slope deviation factor, $K_s$, provides a convenient representation of a level of compensation current, $i_{comp}$, relative to the ion current, $I_{ion}$. For example, when $K_s$ is equal to zero, the compensation current is providing a full compensation; when $K_s > 0$, $i_{comp}$ is overcompensating for the ion current, and when $K_s < 0$, the compensation current, $i_{comp}$, is undercompensating for the ion current.

As shown, the readback values (depicted for example as readback 711-a and readback 711-b) may also be used as part of feedback control. As shown, a first comparator 738 may calculate a difference between a first setpoint 701-*a* and a first readback value 711-*a* to produce a first error signal 721-*a*. And a second comparator 740 may calculate a difference between a second setpoint 701-*b* and a second readback value 711-*b* to produce a second error signal 721-*b*. As shown, the error signals (first and second error signals 721-*a* and 721-*b*, respectively) are fed to one or more compensators 732, and the one or more compensators 732 may provide control signals (control knob 733-*a* and control knob 733-*b*) to the bias supply 208.

Also shown within the digital control section 722 is a timing parameter estimator 734, which may receive the digital representations of the output waveform, $v_{out}$, and the output current, $i_{out}$, and produce a pulse-width control signal. In some examples, the timing parameter estimator 734 detects when there is zero current flowing through switches of the bias supply 208 to reduce switching-related losses. The timing parameter estimator 734 may also determine $t_{reset}$ (shown in FIGS. 4 and 5), where the value for $t_{reset}$ may be reported via the data reporting component 731 and provided to the data processing module 730.

The digital control section 722 also comprises a gate drive signal generator 736 that is configured to provide gate drive signals to the switches (e.g., switches S1 and/or S2 in FIGS. 8A-D) of the bias supply 208 responsive to the pulse-width control signal 737 from the timing parameter estimator 734 and/or responsive to a control signal 739 output by the one or more compensators 732. Although many types of switches are controlled by electrical gate drive signals, it is also contemplated that optical control signals may be used. In one non-limiting example, the gate drive signal generator 736 is configured to provide the optical control signals.

Another aspect of the capabilities of the data processing module 730 includes the ability to compensate for inductance between the output 210 of the bias supply 208 and the input 310 to the plasma chamber.

Figure 8A:
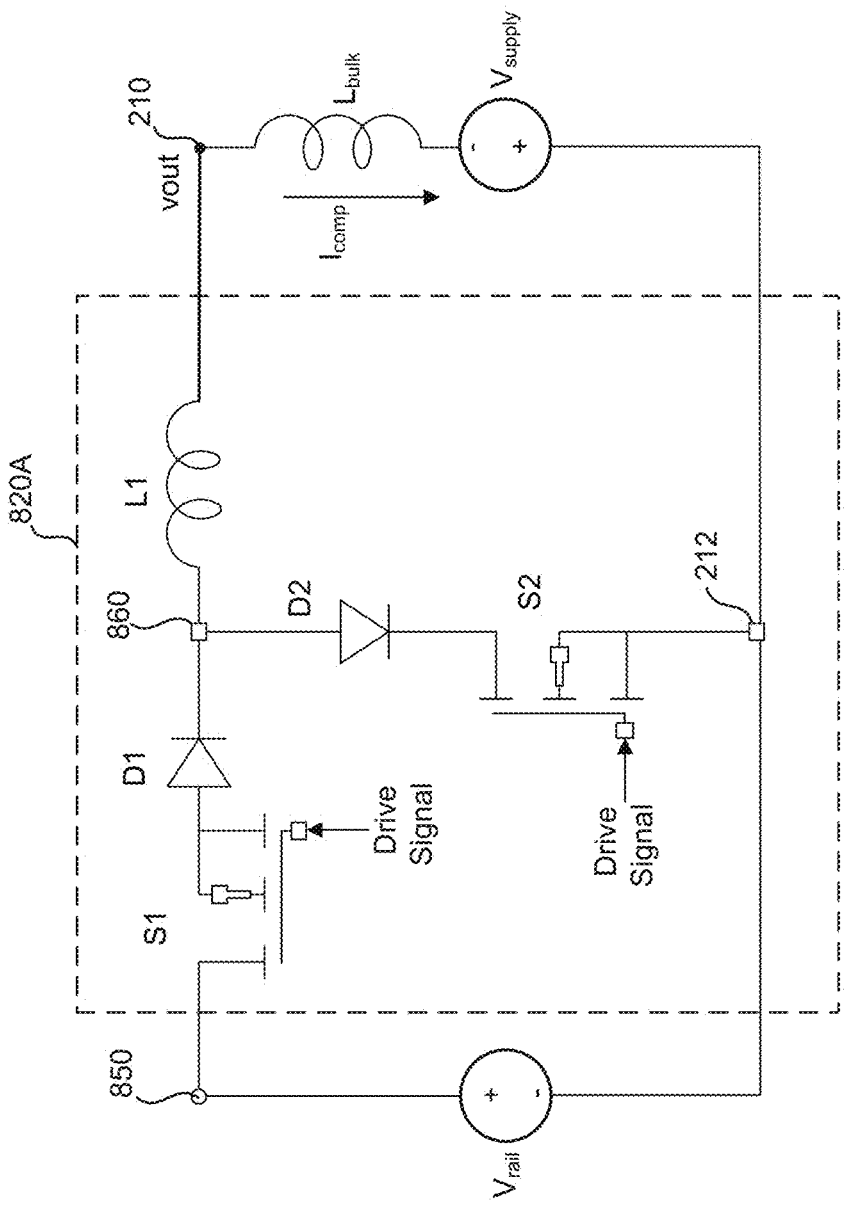
FIG. 8A illustrates an example topology of a bias supply that comprises two power supplies and two active switches, according to various aspects of the disclosure.

FIG. 8A illustrates an example topology of the bias supply 208, comprising a switch network 820A that comprises two active switches, according to various aspects of the disclosure. In this example, the bias supply comprises two switches, S1 and S2, and two power supplies: a first power supply, $V_{rail}$, and a second power supply, $V_{supply}$. The switch network 820A is a two-switch network that couples to $V_{rail}$ at node 850, the return node 212, and the output node 210. Also shown for reference in the switch network 820A is node 860.

As depicted, the switch network 820A comprises a first switch, S1, arranged in series with a first diode D1 between node 850 and node 860. A cathode of the diode D1 is coupled to the node 860 and an anode of the diode D1 is coupled to the switch S1. That is, the switch, S1, is positioned between the positive node of $V_{rail}$ and a diode, D1. The switch network 820A also comprises a second switch S2 (arranged in series with a second diode D2) between the return node 212 and node 860. An anode of the diode D2 is coupled to the node 860 and a cathode of the diode D2 is coupled to the switch S2. In addition, an inductor L1 is positioned between the node 860 and the output node 210. In other words, the cathode of diode D1, the anode of diode D2, and one end of the inductor L1 is coupled to the node 860, while the opposing end of the inductor L1 is coupled to the output node 210. Here, $L_{bulk}$ represents an inductance of the bias supply and is positioned between the output node 210 and the negative node of $V_{supply}$, while the positive node of $V_{supply}$ is coupled to the return node 212. FIG. 8A also depicts the compensation current, $I_{comp}$, flowing through the plasma bulk inductance, $L_{bulk}$. The compensation current, $I_{comp}$, is a controllable DC current that can be controlled by the user to produce the desired output, $v_{out}$, and/or substrate voltage, $v_{sub}$, profile. In some cases, the compensation current, $I_{comp}$, may be controlled in conjunction with the step voltage, $v_{step}$. In some embodiments, a gate drive signal is applied to the switches, S1 and S2, where the gate drive signal is provided via a gate drive signal generator, such as the gate drive signal generator 736 in FIG. 7.

In operation, first diode D1 conducts when the first switch S1 is closed, and a second diode D2 conducts when the second switch D2 is closed. And the first switch S1 and the second switch S2 are controlled as depicted in FIG. 5 to produce the asymmetric periodic voltage waveform $V_{out}$ and the output current $i_{out}$ (shown in FIG. 5). Although not depicted, it should be recognized that the position of the first switch S1 and the position of the first diode D1 may be swapped. Similarly, the position of the second switch S2 and the position of the second diode D2 may be swapped.

Figure 8B:
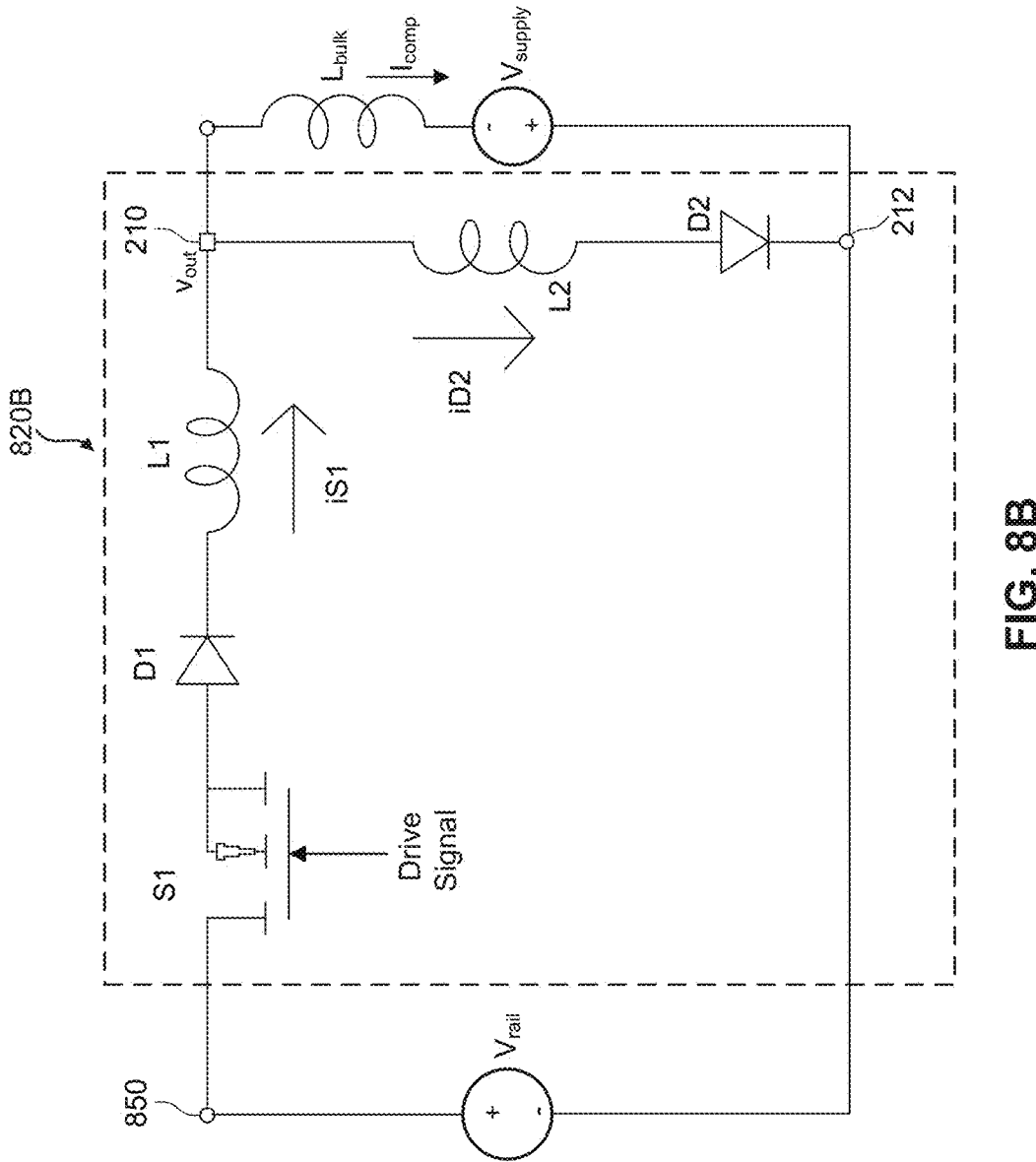
FIG. 8B illustrates an example topology of a bias supply that comprises two power supplies and one active switch, according to various aspects of the disclosure.

FIG. 8B illustrates a second example topology of the bias supply 208, comprising two power supplies, $V_{rail}$ and $V_{supply}$, and a switch network 820B having one active switch, S1, according to various aspects of the disclosure. It should be recognized that the active switch, S1, may comprise several switches arranged in series and/or may comprise several switches arranged in parallel. Thus, switch, S1, generally represents one or more switching components that function as a single switch to provide a single-switched current path between node 212 and node 862.

As shown, the switch network 820B comprises a first current pathway (for current iS1), between the node 850 and the output node 210. The first current pathway comprises a series combination of the switch S1, a diode D1, and an inductor L1. In addition, the switch network 820B comprises second current pathway for current iD2 between the output node 210 and the return node 212, where the second current pathway comprises a second diode D2 and an inductive element, L2, arranged in series.

In operation, the switch S1 in switch network 820B may be operated as shown in FIG. 6 to create the asymmetric periodic waveform $V_{out}$ and the output current $i_{out}$ depicted in FIG. 6. It should be recognized that because the switch S1, the diode D1, and the inductor L1 are arranged in series, the order in which the switch S1, the diode D1, and the inductor L1 are positioned between node 850 and the output node 210 may be swapped.

Figure 8C:
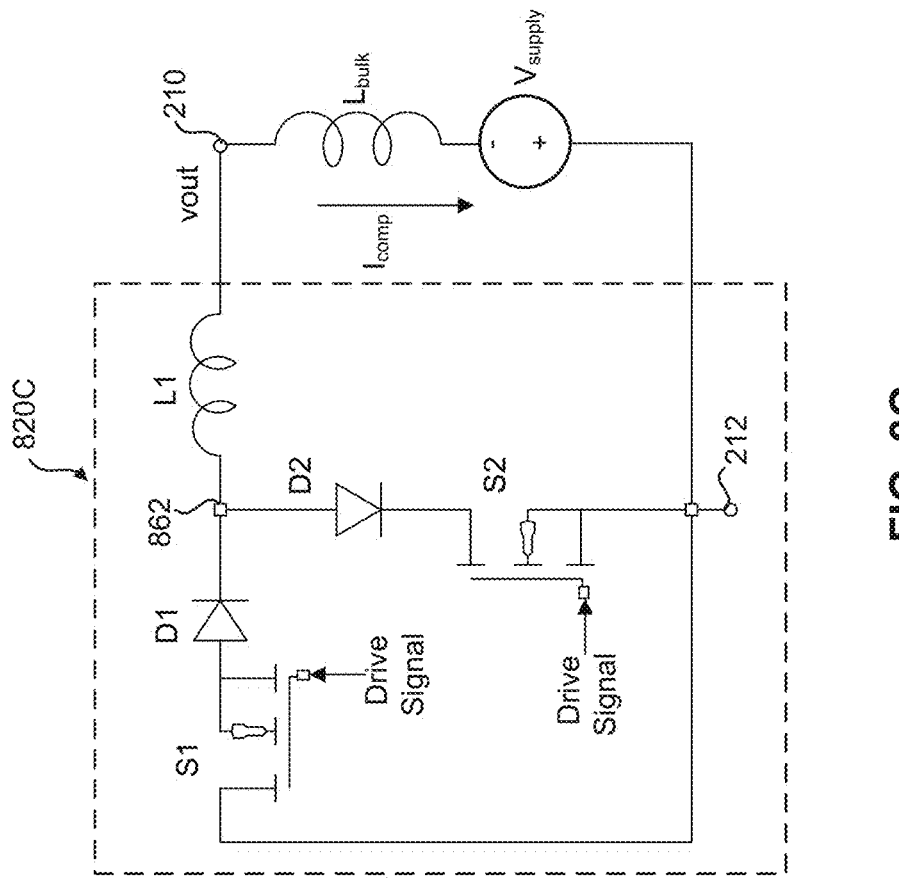
FIG. 8C illustrates an example topology of a bias supply that comprises a single power supply and two active switches, according to various aspects of the disclosure.

FIG. 8C illustrates a third example topology of the bias supply 208, comprising a single power supply, $V_{supply}$, and a switch network 820C comprising two active switches, S1 and S2, according to various aspects of the disclosure. The bias supply in FIG. 8C implements one or more aspects of the bias supplies described in relation to the figures below.

In the variation depicted in FIG. 8C, a series combination of the first switch S1 and the first diode D1 is arranged between the return node 212 of the bias supply and node 862. In addition, a series combination of the second switch S2 and the second diode D2 is arranged between the node 862 and the return node 212 of the bias supply. As shown in FIG. 8C, the first diode D1 is arranged between the first switch S1 and the node 862 with its anode coupled to the first switch S1 and its cathode coupled to the node 862. The second diode D2 is arranged between the second switch S2 and the node 862 with its cathode coupled to the second switch S2 and its anode coupled to the node 862. In this arrangement, the cathode of the first diode D1, the anode of the second diode D2, and one end of the inductor L1 are coupled at the node 862, while the opposing end of the inductor is coupled to the output node 210.

In operation, first diode D1 conducts when the first switch S1 is closed, and a second diode D2 conducts when the second switch D2 is closed. And the first switch S1 and the second switch S2 are controlled as depicted in FIG. 5 to produce the asymmetric periodic voltage waveform $V_{out}$ and the output current $i_{out}$ (shown in FIG. 5). Although not depicted, it should be recognized that the position of the first switch S1 and the position of the first diode D1 may be swapped. Similarly, the position of the second switch S2 and the position of the second diode D2 may be swapped.

Figure 8D:
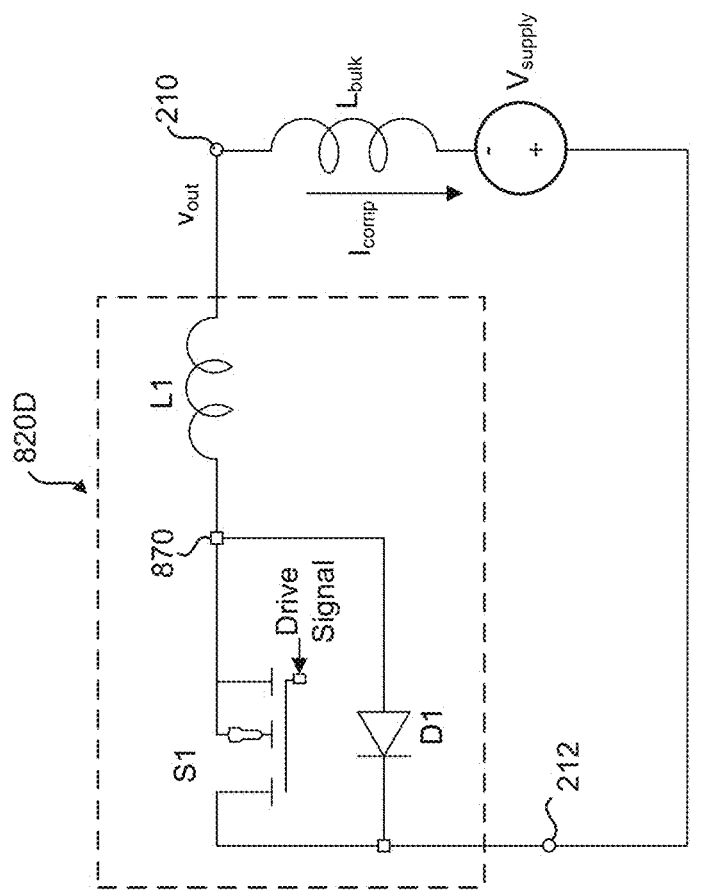
FIG. 8D illustrates an example topology of a bias supply that comprises one power supply and one active switch, according to various aspects of the disclosure.

FIG. 8D illustrates a fourth example topology of the bias supply 208, comprising a single power supply, $V_{supply}$, and a switch network 820D having a single active switch, S1, according to various aspects of the disclosure.

In the switch network 820D shown in FIG. 8D, a first inductor L1 is coupled between a node 870 and the output node 210, and the switch S1 is coupled between the node 870 and the return node 212. A diode D1 is coupled in parallel with the switch S1 between the node 870 and the return node 212. In operation, the switch S1 is opened and closed, as shown in FIG. 6, to produce the asymmetric periodic voltage function $V_{out}$ and the output current $i_{out}$ shown in FIG. 6. For example, an application of the asymmetric periodic voltage waveform is effectuated between the output node 210 and the return node 212 by closing the switch S1 to cause the output current $i_{out}$ to change from $-I_o$ to a peak value and back to $-I_o$. After the switch S1 is opened, the current increases to a peak value in an opposite direction and back to $-I_o$. To reduce or minimize losses, the timing parameter estimator 734 may optionally detect when the output current $i_{out}$ is reaching $I_o$ and provide a signal to the gate drive signal generator 736 to cause the switch S1 to open when the output current $i_{out}$ is at $I_o$.

In operation, the switches S1 and/or S2 described in relation to FIGS. 8A-8D are operated as previously described with reference to FIGS. 2-6, to create the asymmetric periodic waveform, $v_{out}$, and the output current, $i_{out}$, depicted in FIGS. 4 and/or 5. It should be recognized that because the switch S1 and the diode D1 are arranged in series (e.g., in FIGS. 8A-8C) the order of the switch S1 and the diode D1 may be swapped. Similarly, because the switch S2 and the diode D2 are arranged in series (i.e., in FIGS. 8A and C), the order of the switch S2 and the diode D2 may also be swapped.

In many implementations, the switches disclosed herein are realized by field-effect switches, such as, metal-oxide semiconductor field-effect transistors (MOSFETs). In some implementations, the switches are realized by silicon carbide metal-oxide semiconductor field-effect transistors (SiC MOSFETs) or gallium nitride metal-oxide semiconductor field-effect transistors (GaN MOSFETs). As another example, the switches may be realized by insulated gate bipolar transistors (IGBTs). In these implementations, the gate drive signal generator 736 may comprise an electrical driver known in the art that is configured to apply electrical drive signals to the switches responsive to signals from the timing parameter estimator 734 and/or the one or more compensators 732. It is also contemplated that the drive signals may be sent via optical lines to convey optical switching signals. Additionally, the switches may switch in response to the optical signal and/or optical signals that are converted to an electrical drive signal.

It should be recognized that each of the switches depicted herein generally represents one or more switches that are capable of closing and opening to connect and disconnect, respectively, a current pathway. For example, each of the switches may be realized by a plurality of switches arranged is series (for enhanced voltage capability), may be realized by a plurality of switches arranged is parallel (for enhanced current capability), or each of the switches may be comprised of a plurality of switches arranged in a series-parallel combination (for enhanced voltage and or current capability). In these variations, one of ordinary skill in the art will recognize that each switch may be synchronously driven by a corresponding drive signal.

It should also be recognized that any of the diodes depicted herein may be realized by a plurality of diodes. For example, any diode may be realized by a plurality of series-connected diodes (to enhance voltage capability), may be realized by a plurality of diodes arranged in parallel (to enhance current capability), or may be comprised of a plurality of diodes arranged in a series-parallel combination (for enhanced voltage and or current capability).

Figure 9:
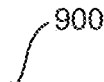
FIG. 9 illustrates an example of a method for predicting plasma behavior by measuring a current waveform using any of the disclosed bias supplies, according to various aspects of the disclosure.
Figure 9:
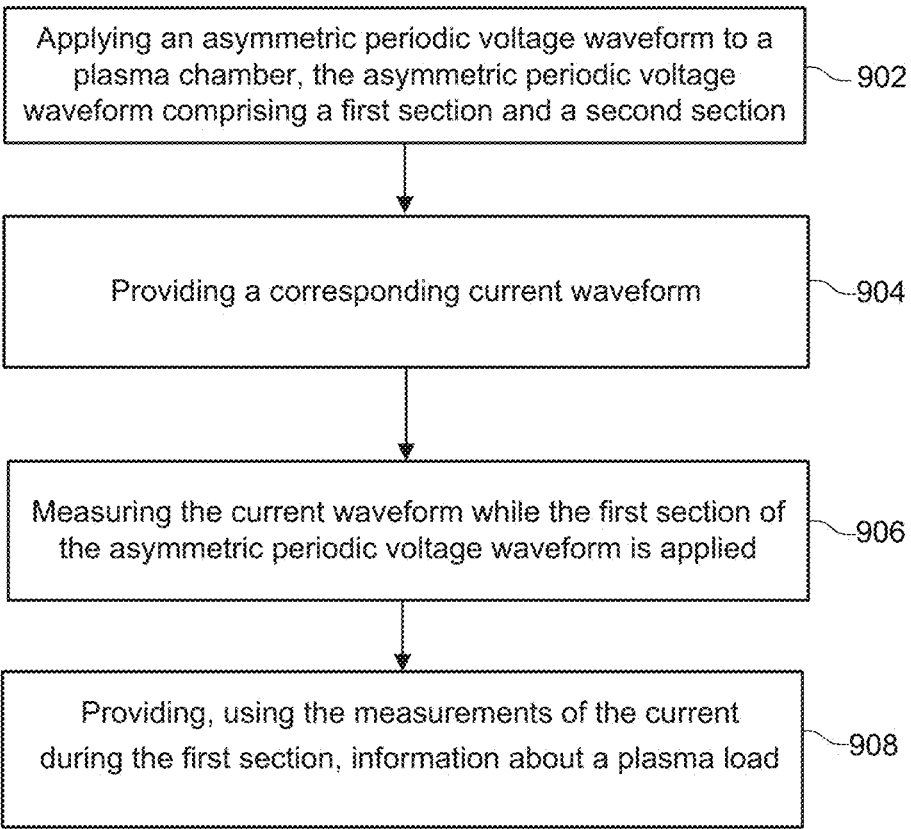

FIG. 9 illustrates an example of a method 900 for predicting plasma behavior by measuring a current waveform with a bias supply (e.g., bias supply 208). As shown, the method includes applying an asymmetric periodic voltage waveform to the plasma chamber 101 (Block 902) and providing a corresponding current waveform (Block 904). Referring again to FIG. 4, the asymmetric periodic voltage waveform can be split into two sections: Section 1 and Section 2. And as shown in FIG. 9, the current waveform is measured during Section 1 of the asymmetric periodic waveform (Block 906). As discussed above, during Section 1 there is a release of energy stored in the plasma load (including energy stored in the chuck and workpiece), and this released energy results in the current in Section 1, which is indicative of activity in the plasma load during Section 2. Information about the plasma load is obtained and provided using the measurements of the current during the first section (Block 908).

By measuring the current, a total charge corresponding to a chuck capacitance may be determined based, at least in part, on integrating the data about the current waveform, and the total charge corresponds to a measure of an ion current flowing from the plasma load to a workpiece surface during Section 2 of the asymmetric periodic voltage waveform. In addition, a time-averaged value of the ion current may be calculated based, at least in part, on the determined total charge.

A resonant frequency of an alternating current (AC) portion of the current waveform may also be determined, and the resonant frequency of the AC portion of the current waveform corresponds to a measure of a sheath capacitance between the workpiece surface and the return node 212 of the bias supply 208. The resonant frequency may be monitored over a plurality of cycles of the asymmetric periodic voltage waveform to monitor the sheath capacitance for changes that may be indicative of undesirable conditions within the plasma chamber 101. As discussed above the information about the plasma load may be used in connection with controlling one or more parameters of the output of the bias supply 208.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC.

Figure 10:
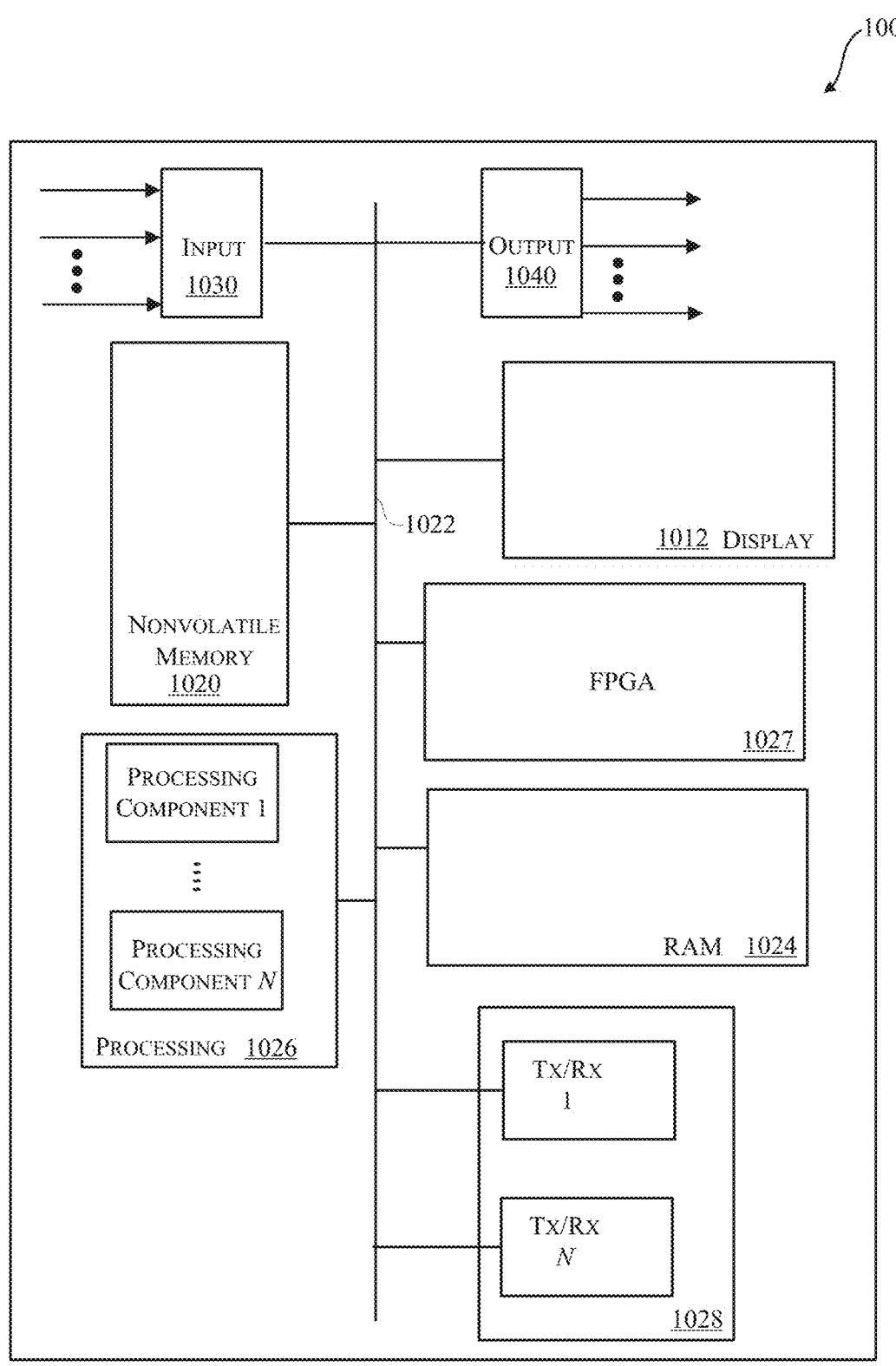
FIG. 10 illustrates a block diagram depicting components that may be utilized to implement control aspects disclosed herein, according to various aspects of the disclosure.

Many embodiments and methods described herein may be realized using a processor in connection with processor executable instructions and a field programmable gate array (programmed by hardware description language instructions). In some embodiments, the FPGA is used for high-speed processing and control, including switching control, measurement, pulsing, and multi-level operation while a processor is utilized for other lower-speed processing. Referring to FIG. 10 for example, shown is a block diagram 1000 depicting physical components of a controller that may be utilized to realize control aspects disclosed herein.

As shown, in this embodiment a display 1012 and non-volatile memory 1020 are coupled to a bus 1022 that is also coupled to random access memory ("RAM") 1024, a processing portion (which includes N processing components) 1026, a field programmable gate array (FPGA) 1027, and a transceiver component 1028 that includes N transceivers. Although the components depicted in FIG. 10 represent physical components, FIG. 10 is not intended to be a detailed hardware diagram; thus, many of the components depicted in FIG. 10 may be realized by common constructs or distributed among additional physical components. Moreover, it is contemplated that other existing and yet-to-be developed physical components and architectures may be utilized to implement the functional components described with reference to FIG. 10.

This display 1012 generally operates to provide a user interface for a user, and in several implementations, the display is realized by a touchscreen display. In general, the nonvolatile memory 1020 is non-transitory memory that functions to store (e.g., persistently store) data and processor-executable code (including executable code that is associated with effectuating the methods described herein). In some embodiments for example, the nonvolatile memory 1020 includes bootloader code, operating system code, file system code, and non-transitory processor-executable code to facilitate the execution of a method for predicting plasma behaviors by measuring current waveform(s), e.g, during asymmetric bias waveform application.

In many implementations, the nonvolatile memory 1020 is realized by flash memory (e.g, NAND or ONENAND memory), but it is contemplated that other memory types may be utilized as well. Although it may be possible to execute the code from the nonvolatile memory 1020, the executable code in the nonvolatile memory is typically loaded into RAM 1024 and executed by one or more of the N processing components in the processing portion 1026.

The N processing components in connection with RAM 1024 generally operate to execute the instructions stored in nonvolatile memory 1020 to enable execution of the algorithms and functions disclosed herein. It should be recognized that several algorithms are disclosed herein, but some of these algorithms are not represented in flowcharts. Processor-executable code to effectuate methods described herein may be persistently stored in nonvolatile memory 1020 and executed by the N processing components in connection with RAM 1024. As one of ordinarily skill in the art will appreciate, the processing portion 1026 may include a video processor, digital signal processor (DSP), microcontroller, graphics processing unit (GPU), or other hardware processing components or combinations of hardware and software processing components (e.g., an FPGA or an FPGA including digital logic processing portions).

In addition, or in the alternative, non-transitory FPGA-configuration-instructions may be persistently stored in nonvolatile memory 1020 and accessed (e.g., during boot up) to configure a field programmable gate array (FPGA) to implement the algorithms disclosed herein.

The input component 1030 may receive power related signals (e.g., signals indicative of output current, $I_{out}$, and voltage, $V_{out}$) obtained (e.g., by current transducers, VI sensors, current transducers, and/or voltage sensors) at the output node 210 and/or return node 212 of the disclosed bias supplies 208. The input component 1030 may also receive signals indicative of current flow, for instance, during capacitor discharge of the chuck capacitance, $C_{chuck}$.

Although not required, in some implementations the FPGA 1027 may be used to realize the metrology module 720 and the FPGA 1027 may sample the power-related signals and provide the digital representations of output current, $I_{out}$, and output voltage $V_{out}$. In some embodiments, the processing components 1026 (in connection with processor-executable instructions stored in the nonvolatile memory 1020) are used to realize the data processing module 730, comparators, and compensators disclosed herein. But the FPGA 1027 may also be used to implement these functions. In addition, the input component 1030 may receive phase information and/or a synchronization signal between bias supplies 108 and source generator 112 that are indicative of one or more aspects of an environment within a plasma processing chamber 101 and/or synchronized control between a source generator and the bias supply (e.g., single switch, dual switch bias supply). The signals received at the input component 1030 may include, for example, synchronization signals, power control signals to the various generators and power supply units, or control signals from a user interface.

Those of ordinary skill in the art will readily appreciate that any of a variety of types of sensors such as, without limitation, directional couplers and voltage-current (VI) sensors, may be used to sample power parameters, such as voltage and current, and that the signals indicative of the power parameters may be generated in the analog domain and converted to the digital domain. In some embodiments, the signals received at the input component 1030 may also include one or more of (1) signals indicative of a total charge held in the chuck capacitor as a result of ion current flowing from the plasma to the wafer or substrate surface, (2) signals indicative of plasma characteristics derived from measuring the current flow during the capacitive discharge, (3) signals indicative of the integrated current associated with the capacitive discharge event, (4) signals indicative of the total charge released from the chuck capacitance, (5) signals indicative of the time-averaged ion current, (6) signals indicative of the resonant frequency of the AC portion of the output current, and (7) signals indicative of the time to reach full capacitive discharge, to name a few non-limiting examples.

The output component 1040 generally operates to provide one or more analog or digital signals to effectuate the gate drive signals for opening and closing of the switches. The output component 1040 may also control one or more aspects of the power supplies described herein.

The depicted transceiver component 1028 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

As used herein, the recitation of "at least one of A, B and C" or "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A biasing system comprising:
an output node;
a bias supply configured to apply an asymmetric periodic voltage waveform and provide a corresponding current waveform at the output node wherein the asymmetric periodic voltage waveform comprises:
a first section that begins with a first negative voltage and changes to a peak voltage before changing to a second negative voltage; and
a second section that begins with the second negative voltage and comprises a voltage ramp between the second negative voltage and a third negative voltage; and
a metrology module comprising at least hardware, the metrology module configured to receive data about the current waveform during the first section and provide, based upon the current waveform during the first section, information about a plasma load during the second section when the bias supply is coupled to the plasma load.

2. The biasing system of claim 1, wherein the metrology module is configured to determine a total charge corresponding to a chuck capacitance based, at least in part, on integrating the data about the current waveform, and wherein the total charge corresponds to a measure of an ion current flowing from the plasma load to a workpiece surface during the second section of the asymmetric periodic voltage waveform.

3. The biasing system of claim 2, wherein the metrology module is configured to calculate a time-averaged value of the ion current of the plasma load based, at least in part, on the determined total charge.

4. The biasing system of claim 1, wherein the metrology module is configured to determine a resonant frequency of an alternating current (AC) portion of the current waveform, wherein the resonant frequency of the AC portion of the current waveform corresponds to a measure of a sheath capacitance.

5. The biasing system of claim 4, wherein the metrology module is further configured to:
monitor the resonant frequency as a function of time.

6. The biasing system of claim 5, wherein the metrology module is further configured to monitor the resonant frequency over a plurality of cycles of the asymmetric periodic voltage waveform.

7. The biasing system of claim 1, wherein the bias supply comprises a switch network and at least one power supply.

8. The biasing system of claim 7, wherein the bias supply comprises:
at least two switches wherein, when closed, a first of the at least two switches causes the bias supply to apply the peak voltage, and when closed, another of the at least two switches causes the bias supply to apply the second negative voltage.

9. The biasing system of claim 7, wherein the switch network comprises:
a single-switched current path, wherein the bias supply is configured to periodically close and open the single-switched current path to apply the asymmetric periodic voltage waveform and provide the corresponding current waveform at the output node.

10. The biasing system of claim 7, wherein the bias supply comprises at least two switches and at least two power supplies.

11. A method for predicting plasma behavior, comprising:
applying an asymmetric periodic voltage waveform to a plasma processing chamber, the asymmetric periodic voltage waveform comprising:
a first section that begins with a first negative voltage and changes to a second, peak voltage before changing to a second negative voltage; and a second section that begins with the second negative voltage and comprises a voltage ramp between the second negative voltage and a third negative voltage; and providing a current waveform that corresponds to the asymmetric periodic voltage waveform;

measuring the current waveform while the first section of the asymmetric periodic voltage waveform is applied; and providing, using the measurements of the current during the first section, information about a plasma load during the second section.

12. The method of claim 11, further comprising:

determining a total charge corresponding to a chuck capacitance based, at least in part, on integrating data about the current waveform, and wherein the total charge corresponds to a measure of an ion current flowing from the plasma load to a workpiece surface during the second section of the asymmetric periodic voltage waveform.

13. The method of claim 12, further comprising:

calculating a time-averaged value of the ion current based, at least in part, on the determined total charge; and determining a resonant frequency of an alternating current (AC) portion of the current waveform, wherein the resonant frequency of the AC portion of the current waveform corresponds to a measure of a sheath capacitance.

14. The method of claim 11, comprising:

monitoring a resonant frequency of an alternating current (AC) portion of the current waveform.

15. The method of claim 14, further comprising:

monitoring the resonant frequency over a plurality of cycles of the asymmetric periodic voltage waveform.

16. A non-transient computer-readable storage medium having instructions embodied thereon, the instructions are executable by a processor and/or capable of programming a field programmable gate array, the instructions comprising instructions for:

applying an asymmetric periodic voltage waveform at an output node of a bias supply, the asymmetric periodic voltage waveform comprising:

a first section that begins with a first negative voltage and changes to a second, peak voltage before changing to a second negative voltage;

a second section that begins with the second negative voltage and comprises a voltage ramp between the second negative voltage and a third negative voltage; and providing a current waveform that corresponds to the asymmetric periodic voltage waveform;

measuring the current waveform while the first section of the asymmetric periodic voltage waveform is applied; and providing, using the measurements of the current during the first section, information about a plasma load during the second section.

17. The non-transient computer-readable storage medium of claim 16, wherein the instructions comprise instructions for determining a total charge corresponding to a chuck capacitance based, at least in part, on integrating data about the current waveform, and wherein the total charge corresponds to a measure of an ion current flowing from the plasma load to a workpiece during the second section of the asymmetric periodic voltage waveform.

18. The non-transient computer-readable storage medium of claim 17, wherein the instructions comprise instructions for:

calculating a time-averaged value of the ion current based, at least in part, on the determined total charge; and determining a resonant frequency of an alternating current (AC) portion of the current waveform, wherein the resonant frequency of the AC portion of the current waveform corresponds to a measure of a sheath capacitance.

19. The non-transient computer-readable storage medium of claim 16, wherein the instructions comprise instructions for:

monitoring a resonant frequency of an alternating current (AC) portion of the current waveform; and monitoring the resonant frequency over a plurality of cycles of the asymmetric periodic voltage waveform.

* * * * *